US008067084B2

(12) United States Patent
Yoshikawa et al.

(10) Patent No.: US 8,067,084 B2
(45) Date of Patent: Nov. 29, 2011

(54) ELECTROMAGNETIC-WAVE SHIELDING AND LIGHT TRANSMITTING PLATE, MANUFACTURING METHOD THEREOF, AND DISPLAY PANEL

(75) Inventors: Masato Yoshikawa, Kodaira (JP); Tetsuo Kitano, Kodaira (JP); Taichi Kobayashi, Kodaira (JP); Hidefumi Kotsubo, Kodaira (JP)

(73) Assignee: Bridgestone Corporation, Tokyo (JP)

( * ) Notice: Subject to any disclaimer, the term of this patent is extended or adjusted under 35 U.S.C. 154(b) by 695 days.

(21) Appl. No.: 11/695,867

(22) Filed: Apr. 3, 2007

(65) Prior Publication Data

US 2007/0190296 A1    Aug. 16, 2007

Related U.S. Application Data

(62) Division of application No. 10/476,852, filed as application No. PCT/JP02/04423 on May 7, 2002, now Pat. No. 7,214,282.

(30) Foreign Application Priority Data

May 16, 2001   (JP) ................ 2001-146843
May 16, 2001   (JP) ................ 2001-146844
May 16, 2001   (JP) ................ 2001-146845
May 16, 2001   (JP) ................ 2001-146846
May 16, 2001   (JP) ................ 2001-146847

(51) Int. Cl.
    *B32B 15/08*    (2006.01)
    *B32B 3/00*     (2006.01)

(52) U.S. Cl. ...................... 428/201; 428/209

(58) Field of Classification Search .................. None
See application file for complete search history.

(56) References Cited

U.S. PATENT DOCUMENTS 6,090,473 A * 7/2000 Yoshikawa et al. ........... 428/209
(Continued)

FOREIGN PATENT DOCUMENTS

EP             0840542 A1       5/1998
(Continued)

OTHER PUBLICATIONS

English translation of JP 2000-236194 Translated by Schreiber Translations, Inc. Sep. 2010.*

(Continued)

*Primary Examiner* — Jennifer McNeil
*Assistant Examiner* — Adam Krupicka
(74) *Attorney, Agent, or Firm* — Sughrue Mion, PLLC

(57) ABSTRACT

An electromagnetic-wave shielding and light transmitting plate 1 comprising an antireflection film 3, an electromagnetic-wave shielding film 10, a transparent substrate 2, and a near-infrared ray blocking film 5, wherein they are laminated and united by using intermediate adhesive layers 4A, 4B and a pressure-sensitive adhesive 4C, and the peripheries thereof are covered by a conductive sticky tape 7. The electromagnetic-wave shielding film 10 has a conductive foil 11 formed by pattern etching on a substrate film 13, is processed to have antireflection function by forming a light absorbing layer 12 on the conductive foil 11, and is subjected to a matting process to form small irregularities by roughening the surface of the light absorbing layer 12. A display panel is manufactured by bonding this electromagnetic-wave shielding film 10 to the front surface of a plasma display panel body. Accordingly, an electromagnetic-wave shielding and light transmitting plate and a display panel can be obtained which not only have excellent electromagnetic-wave shielding function but also provide high antireflection effect and have high level of transparency and high level of visibility, thereby providing distinct images.

11 Claims, 15 Drawing Sheets

U.S. PATENT DOCUMENTS

| | | |
|---|---|---|
| 6,197,408 B1 | 3/2001 | Kanbara et al. |
| 6,221,543 B1 | 4/2001 | Guehler et al. |
| 6,235,398 B1 * | 5/2001 | Nakamura et al. ............ 428/432 |
| 6,433,481 B1 | 8/2002 | Marutsuka et al. |
| 2002/0033661 A1 * | 3/2002 | Sugimachi et al. ........... 313/479 |

FOREIGN PATENT DOCUMENTS

| | | |
|---|---|---|
| EP | 0851452 A2 | 7/1998 |
| EP | 0977167 A1 | 2/2000 |
| EP | 1263816 A2 | 10/2002 |
| JP | 10-41682 A | 2/1998 |
| JP | 11-52875 A | 2/1999 |
| JP | 11-145678 A | 5/1999 |
| JP | 11-251782 A | 9/1999 |
| JP | 2000-36687 A | 2/2000 |
| JP | 2000-171615 A | 6/2000 |
| JP | 2000-174491 A | 6/2000 |
| JP | 2000-236194 A | 8/2000 |
| JP | 2000-286593 A | 10/2000 |
| JP | 2000-286594 A | 10/2000 |
| JP | 2001-053488 A | 2/2001 |
| KR | 100252375 B1 | 1/2000 |

OTHER PUBLICATIONS

Korean Office Action dated Oct. 31, 2008 (5 pages).

Japanese Office Action corresponds to Jp 2001-146843 dated Mar. 29, 2011.

Japanese Office Action corresponds to JP 2001-146846 dated Mar. 29, 2011.

* cited by examiner ly, the present invention relates to an electromagnetic-wave shield-

ELECTROMAGNETIC-WAVE SHIELDING AND LIGHT TRANSMITTING PLATE, MANUFACTURING METHOD THEREOF, AND DISPLAY PANEL

CROSS REFERENCE TO RELATED APPLICATION

This is a divisional application of the U.S. application Ser. No. 10/476,852 filed on Nov. 6, 2003, now U.S. Pat. No. 7,214,282, which is a National Stage entry of PCT/JP02/04423 filed May 7, 2002, which claims benefit to JP 2001-146843, JP 2001-146844, JP 2001-146845, JP 2001-146846 and JP 2001-146847 all of which were filed on May 16, 2001. The prior applications are hereby incorporated by reference as if fully set forth herein.

FIELD OF THE INVENTION

The present invention relates to an electromagnetic-wave shielding and light transmitting plate, a manufacturing method thereof, and a display panel. More particularing and light transmitting plate which has excellent electromagnetic-wave shielding function, a high level of transparency, and a high level of visibility so that it can be suitably used as a front filter for a PDP (plasma display panel) and a manufacturing method thereof and further relates to a display panel which is integrally provided with an electromagnetic-wave shielding film as mentioned above so as to add functions such as electromagnetic-wave shielding function to the display panel itself, improving the productivity because of reduction in weight, thickness, and number of parts of the display panel and enabling the reduction in cost.

BACKGROUND OF THE INVENTION

PDPs (plasma display panels) utilizing discharge phenomenon have been used as display panels for television sets, office automation apparatuses such as personal computers and word processors, traffic control signs, signboards, and other display boards.

The display mechanism of a PDP basically comprises two glass plates, a large number of discharge cells formed by partitions between the two grass plates, and fluorescent substrates within the respective discharge cells. The fluorescent substrates are selectively excited to emit light by discharge, thereby displaying characters and/or figures. An exemplary embodiment is shown in FIG. 16. In FIG. 16, reference numeral 21 designates a front glass, 22 designates a rear glass, 23 designates partitions, 24 designates display cells (discharge cells), 25 designates auxiliary cells, 26 designates cathodes, 27 designates display anodes, and 28 designates auxiliary anodes. Disposed in each display cell 24 is a red, green, or blue phosphor (not shown) which is a film-like form attached to the inside thereof. These fluorescent substrates emit light by electrical discharges when a voltage is applied between electrodes.

From the front surface of the PDP, electromagnetic waves with frequency from several kHz to several GHz are generated due to applying voltage, electrical discharge, and light emission. The electromagnetic waves are required to be shielded. In addition, for improving its display contrast, reflection of external light at the front surface is required to be prevented.

In order to shield such electromagnetic waves from PDP, conventionally, a transparent plate which has functions such as electromagnetic-wave shielding function is disposed in front of the PDP.

Electromagnetic-wave shielding material as mentioned above is also utilized as a window of a place where a precision apparatus is installed, such as a hospital or a laboratory, in order to protect the precision apparatus from electromagnetic waves for example from cellular phones.

A conventional electromagnetic-wave shielding and light transmitting plate typically comprises transparent substrates such as acrylic boards and a conductive mesh member like a wire netting or a transparent conductive film and is formed by interposing the conductive mesh member or the transparent conductive film between the transparent substrates and uniting them.

A conductive mesh member which is employed in the conventional electromagnetic-wave shielding and light transmitting plate is a 5- to 500-mesh member having a wire diameter from 10 to 500 μm and an open area ratio (open area percentage) less than 75%. The electromagnetic-wave shielding and light transmitting plate employing such a conductive mesh member has low light transmittance of 70% at the most.

Moreover, a display comprising an electromagnetic-wave shielding and light transmitting plate with such a conventional conductive mesh member easily allow the production of moiré patterns due to relations between its patterns and pixel pitch.

As means for solving these problems, it has been proposed to use a pattern-etched conductive foil as an electromagnetic-wave shielding layer instead of the conductive mesh (JP 2000-174491A). An electromagnetic-wave shielding and light transmitting plate provided with the pattern-etched conductive foil having desired line width, distance, and mesh configuration has excellent electromagnetic-wave shielding characteristics and a high level of light transmittance and can prevent moiré phenomenon.

The pattern etching of this conductive foil is achieved by bonding a metal foil onto a surface of a transparent substrate film, attaching a photoresist film to the metal foil with pressure, and etching into a predetermined pattern through pattern exposure and etching steps. Accordingly, the metal foil is provided as a film laminated on the substrate film.

An electromagnetic-wave shielding film comprising such a laminated film of the metal foil/the substrate film can not have sufficient visibility because light is reflected at the surface of the metal foil.

SUMMARY OF THE INVENTION

It is an object of the present invention to provide an electromagnetic-wave shielding and light transmitting plate which not only has excellent electromagnetic-wave shielding function but also provides high antireflection effect and has a high level of transparency and a high level of visibility.

It is another object of the present invention to provide a display panel employing an electromagnetic-wave shielding film which not only has excellent electromagnetic-wave shielding function but also provides high antireflection effect and has a high level of transparency and a high level of visibility.

An electromagnetic-wave shielding and light transmitting plate according to the first aspect of the present invention is an electromagnetic-wave shielding and light transmitting plate having at least an electromagnetic-wave shielding film and a transparent substrate which are laminated and united, wherein the electromagnetic-wave shielding film comprising a transparent substrate film and a conductive foil which is formed by pattern etching and is bonded to the transparent substrate side surface of the substrate film with a transparent adhesive agent, the foil has a light absorbing layer for antireflection on the substrate film side surface thereof, and the substrate film side surface of the light absorbing layer is treated by surface roughening.

In the electromagnetic-wave shielding film, small irregularities are formed in the surface of the light absorbing layer by the surface roughening (hereinafter, the surface roughening will be sometimes referred to as "matting process") so as to provide high antireflection effect. Therefore, by applying the electromagnetic-wave shielding and light transmitting plate with this electromagnetic-wave shielding film to a front surface of a display, the display can provide a distinct image having high contrast.

The electromagnetic-wave shielding film comprising the pattern-etched conductive foil, the matted light absorbing layer, and the substrate film is manufactured by the following steps:

(1) forming a light absorbing layer on the surface of the metallic foil and treating a surface of the light absorbing layer by surface roughening;

(2) bonding the metallic foil obtained by the above (1) to a transparent substrate film by transparent adhesive agent; and (3) pattern-etching the laminated body obtained by the above (2).

In the bonding step of the above (2), the irregularities of the surface of the matted light absorbing layer are transferred to the transparent adhesive layer. Therefore, the surface of the transparent adhesive layer exposed after etching and removing the light absorbing layer and the metallic foil by pattern etching has irregularities transferred from the light absorbing layer.

The irregularities of the transparent adhesive layer have light scattering property. Accordingly, in the present invention, as claimed in claim 2 or 5, it is preferable that the irregularities transferred to the transparent adhesive layer is filled with thermosetting resin or transparent pressure-sensitive adhesive by bonding the foil side surface of the electromagnetic-wave shielding film to the transparent substrate with the thermosetting resin or the transparent pressure-sensitive adhesive, thereby preventing the light scattering and thus improving the transparency.

An electromagnetic-wave shielding and light transmitting plate according to the second aspect of the present invention is an electromagnetic-wave shielding and light transmitting plate having at least an electromagnetic-wave shielding film and a transparent substrate which are laminated and united, wherein the electromagnetic-wave shielding film comprising a transparent substrate film and a conductive foil which is formed by pattern etching and is bonded to a surface opposite to the transparent substrate side surface of the substrate film with a transparent adhesive agent, the foil has a light absorbing layer for antireflection on a surface opposite to the substrate film side surface thereof, and the surface opposite to the substrate film side surface of the light absorbing layer is treated by surface roughening.

Also in the electromagnetic-wave shielding film, the surface of the light absorbing layer is treated by the surface roughening so as to provide high antireflection effect. Therefore, by applying the electromagnetic-wave shielding and light transmitting plate with this electromagnetic-wave shielding film to a front surface of a display, the display can provide a distinct image having high contrast.

The electromagnetic-wave shielding film comprising the matted light absorbing layer, the pattern-etched conductive foil, and the substrate film is manufactured by the following steps:

(i) bonding the metallic foil to the transparent substrate film by transparent adhesive agent;

(ii) pattern-etching a laminated body obtained by the above (i); and (iii) forming a light absorbing layer on the surface of the pattern-etched metallic foil and treating a surface of the light absorbing layer by surface roughening.

A manufacturing method of an electromagnetic-wave shielding and light transmitting plate according to the third aspect of the present invention is a method of manufacturing the electromagnetic-wave shielding and light transmitting plate by laminating and uniting at least an electromagnetic-wave shielding film and a transparent substrate and is characterized by comprising: a step of forming a light absorbing layer on one surface of a conductive foil; a step of treating a surface of the light absorbing layer by surface roughening; a step of bonding the conductive foil with the light absorbing layer to a transparent substrate film by transparent adhesive agent; a step of pattern etching the conductive foil with the light absorbing layer bonded on the substrate film; a step of forming a coating layer by applying a transparent pressure-sensitive adhesive on the etched surface of the electromagnetic-wave shielding film obtained by the pattern etching; and a step of attaching the coating layer of the electromagnetic-wave shielding film to the transparent substrate with some pressure so as to laminate and unite the electromagnetic-wave shielding film and the transparent substrate.

In this method, the electromagnetic-wave shielding film comprising the pattern-etched conductive foil, the matted light absorbing layer, and the substrate film is manufactured by the aforementioned steps (1)-(3). As mentioned above, the surface of the transparent adhesive layer exposed after etching and removing the light absorbing layer and the metallic foil by pattern etching has irregularities transferred from the light absorbing layer.

The irregularities of the transparent adhesive layer have light scattering property. According to the present invention, the irregularities transferred to the transparent adhesive layer is filled with transparent pressure-sensitive adhesive by applying the transparent pressure-sensitive adhesive to the foil side surface of the electromagnetic-wave shielding film, thereby preventing the light scattering and thus improving the transparency.

In this case, the transparent pressure-sensitive adhesive allows re-adhesion and can bond strongly the electromagnetic-wave shielding film and the transparent substrate or the like together without capturing air bubbles between their boundary faces.

The thickness of the coating layer of the transparent pressure-sensitive adhesive is preferably from 1 to 100 μm. The coating layer having such a thickness can absorb the irregularities of the matted surface of the light absorbing layer and has a good workability for bonding the electromagnetic-wave shielding film to the transparent substrate or the like.

The electromagnetic-wave shielding film may be bonded to the transparent substrate via another film. However, it is preferable that the electromagnetic-wave shielding film is directly bonded to the transparent substrate with transparent pressure-sensitive adhesive.

A display panel according to the fourth aspect of the present invention is a display panel comprising a display panel body and an electromagnetic-wave shielding film disposed on the front surface of the display panel body, wherein the electromagnetic-wave shielding film comprises a transparent substrate film and a conductive foil which is formed by pattern etching and is bonded to the display panel body side surface of the substrate film with a transparent adhesive agent, the foil has a light absorbing layer for antireflection on the substrate film side surface thereof, and the substrate film side surface of the light absorbing layer is treated by surface roughening.

A display panel according to the fifth aspect of the present invention is a display panel comprising a display panel body and an electromagnetic-wave shielding film disposed on the front surface of the display panel body, wherein the electromagnetic-wave shielding film comprises a transparent substrate film and a conductive foil which is formed by pattern etching and is bonded to a surface opposite to the display panel body side surface of the substrate film with a transparent adhesive agent, the foil has a light absorbing layer for antireflection on a surface opposite to the substrate film side surface thereof, and the surface opposite to the substrate film side surface of the light absorbing layer is treated by surface roughening.

These display panels are each formed by disposing an electromagnetic-wave shielding film on a front surface of a display panel body, thereby achieving the reduction in weight, thickness, and the number of parts of the display panel, leading to the improvement of the productivity and reducing the cost.

In the electromagnetic-wave shielding film, small irregularities are formed in the surface of the light absorbing layer by the surface roughening so as to provide high antireflection effect. Therefore, by applying this electromagnetic-wave shielding film to a front surface of a display panel body, the display can provide a distinct image having high contrast.

DETAILED DESCRIPTION OF THE PREFERRED EMBODIMENTS

Embodiments of the present invention will be described in detail with reference to the attached drawings.

With reference to FIGS. 3A-3F, an exemplary method of manufacturing an electromagnetic-wave shielding film to be used in an electromagnetic-wave shielding and light transmitting plate of the first aspect of the present invention will be described.

Figure 3:
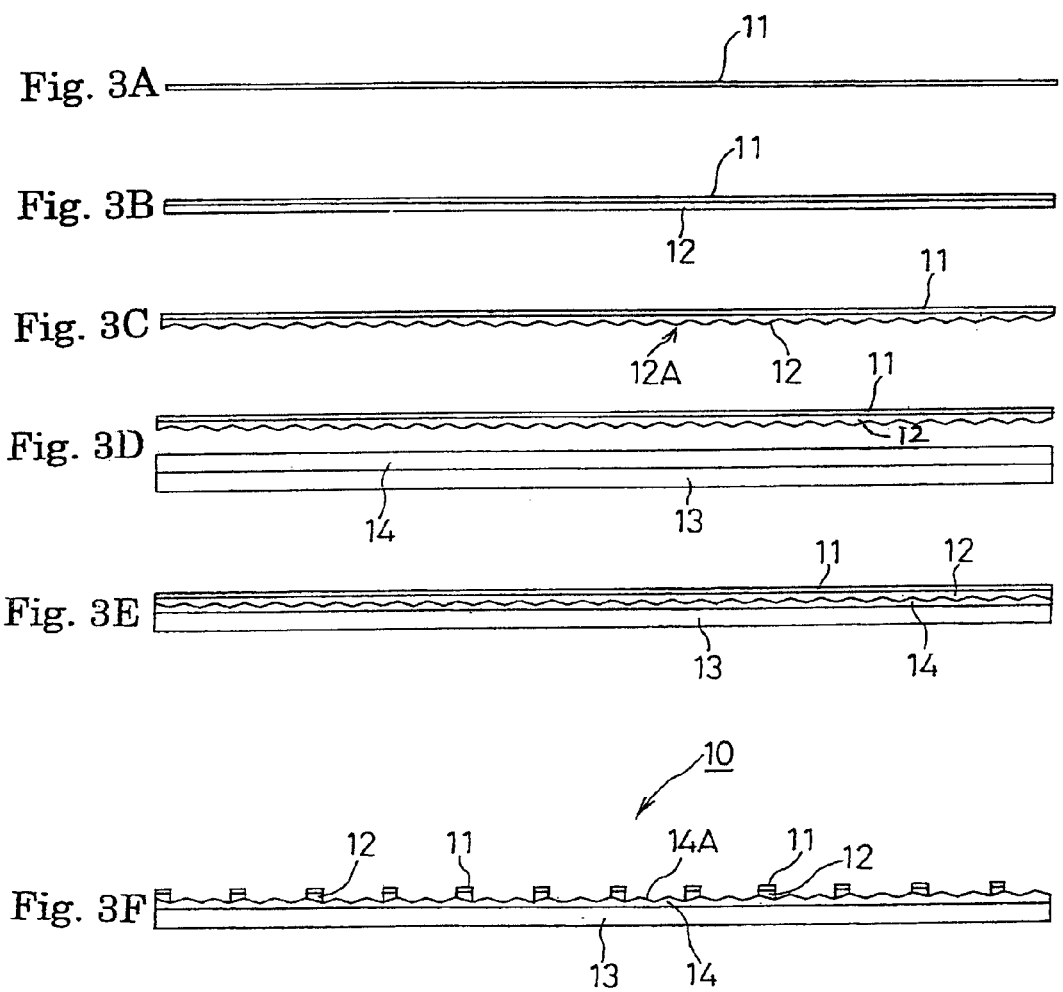
FIGS. 3A-3F are explanatory illustrations showing an exemplary method of manufacturing an electromagnetic-wave shielding film to be used in the first aspect.

For example, a copper foil 11 is prepared as a conductive foil (FIG. 3A) and a light absorbing layer 12 is formed on one surface of the copper foil 11 (FIG. 3B). As a forming method of this light absorbing layer 12, there is a method of making a film of a copper alloy such as Cu—Ni and, after that, blackening a surface of the film by treatment with acid or alkali. The blackened surface subjected to this surface treatment is roughened. The surface roughness Rz can be controlled according to the treatment condition. Alternatively, the light absorbing layer 12 can be formed by applying a light absorbing ink onto the copper foil 11 and hardening the ink. Examples of the light absorbing ink used here include carbon ink, nickel ink, and inks such as dark color organic pigments. Then, the light absorbing layer 12 is subjected to a matting process to form small irregularities by mechanically roughening, for example, shot blasting the surface 12A thereof or chemically roughening the surface 12A using acid or alkali, alternatively, by applying the ink which is previously mixed with the inorganic or organic fine particles so as to form a film originally having roughened surface (FIG. 3C). The thickness of the light absorbing layer 12 varies depending on the blackening material and/or the conductivity, but it is preferable that the thickness is in a range from 1 nm to 10 μm in order to have sufficient electromagnetic-wave shielding property without losing its conductivity. The level of roughness of the surface 12A is preferably in a range from 0.1 to 20 μm as surface roughness Rz in order to sufficiently prevent the light scattering. The matting process is carried out such that the surface roughness Rz of the light absorbing layer becomes 0.1-20 μm, thereby providing high antireflection effect.

After that, the copper foil 11 on which the light absorbing layer 12 is formed and treated by the matting process to have a matte surface is bonded at its matte surface side to a transparent substrate film such as a PET (polyethylene terephthalate) film 13 with a transparent adhesive agent 14 (FIG. 3D, FIG. 3E).

Pattern etching is conducted on the thus obtained laminated film according to the normal method, whereby the copper foil 11 with the light absorbing layer 12 formed thereon is partially removed so as to obtain a copper/PET laminated etched film 10 as the electromagnetic-wave shielding film (FIG. 3F).

Exposed surface 14A of the transparent adhesive agent 14 of the copper/PET laminated etched film 10 has irregularities corresponding to the small irregularities, formed by the matting process, of the light absorbing layer 12.

The conductive foil composing the electromagnetic-wave shielding film is not limited to copper foil and may be a foil of stainless steel, aluminum, nickel, iron, brass, or alloy thereof. Among these, copper foil, stainless steel foil, and aluminum foil are preferable.

Since too thin metal foil is not preferable in view of the handling property and the workability of pattern etching and too thick metal foil is also not preferable because it undesirably increases the thickness of an obtained electromagnetic-wave shielding and light transmitting plate and lengthens the time required for the etching process, the thickness of the metal foil is preferably in a range from 1 to 200 μm.

The method of pattern etching for the metal foil may be any of widely used methods. Photo etching using a resist is preferable. In this case, a photoresist film is attached to the metal foil with pressure or a photoresist is applied by coating, and a pattern is then exposed by using a desired mask or the like and, after that, is developed by developing process, thereby forming a resist pattern. Portions of the metal foil not covered by the resist are removed with etchant such as ferric chloride solution.

The method using the photoresist film is preferable because the photoresist film, the metal foil with the light absorbing layer formed thereon and treated by the matting process, the adhesive sheet of transparent adhesive agent, and the substrate film are laminated in the order of the substrate film/the adhesive sheet/the metal foil/the photoresist film and bonded together with pressure, whereby these can be laminated and united only in one step.

According to the pattern etching, the degree of freedom of pattern is high so that the metal foil can be etched into a pattern having any line width, any distance, and any hole shape, thereby easily forming an electromagnetic-wave shielding film capable of providing desired electromagnetic-wave shielding function and light transmittance without moiré phenomenon.

Figure 4:
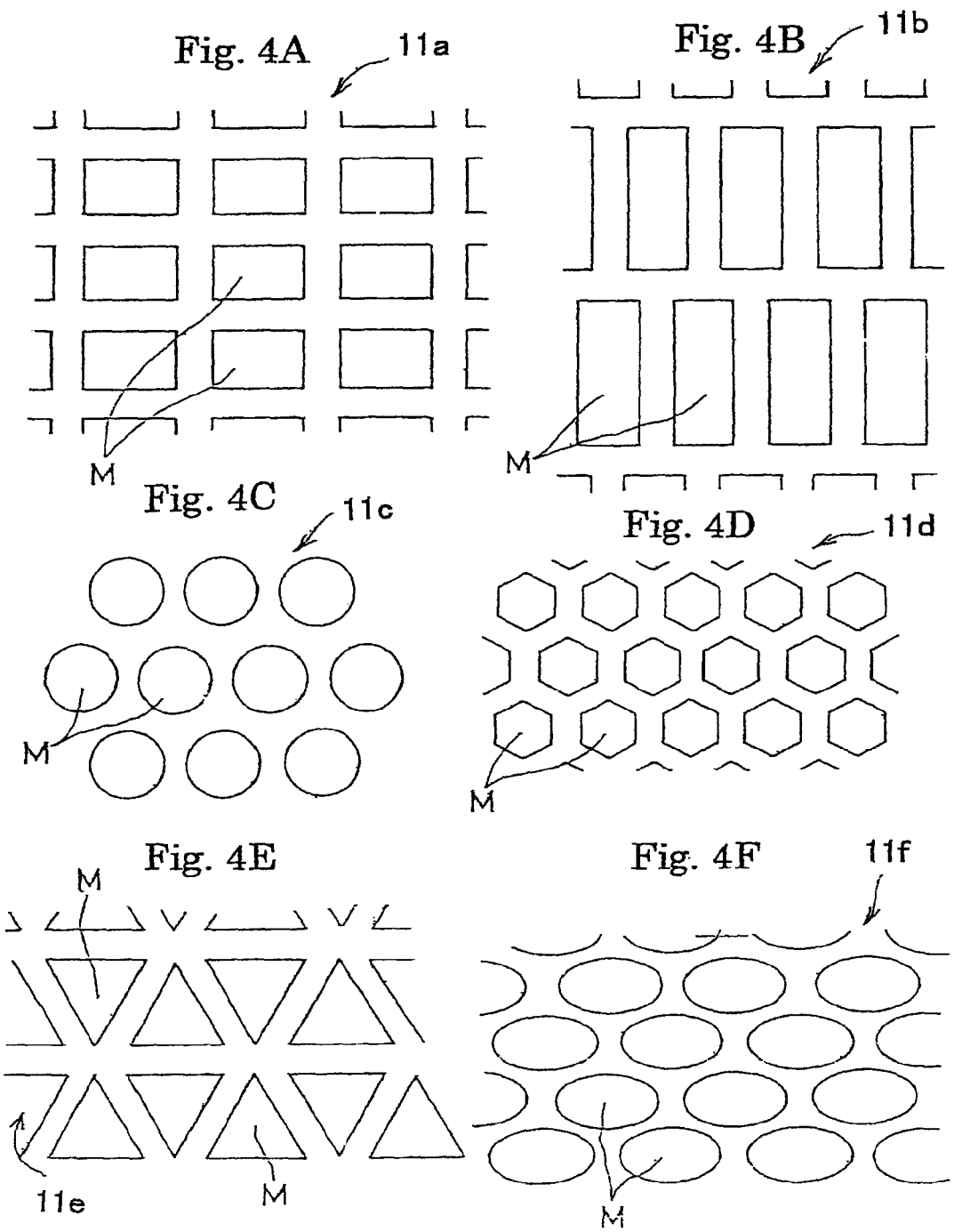
FIGS. 4A-4F are plan views showing concrete examples of etching patterns.

There is no particular limitation on the configuration of the etching pattern of the metal foil. The etching pattern may be a metal foil 11a or 11b formed with rectangular holes M as shown in FIGS. 4A, 4B, a metal foil 11c, 11d, 11d, 11e, or 11f formed in a punched metal-like shape with circular, hexagonal, triangular or oval holes M as shown in FIGS. 4C, 4D, 4E, 4F. Instead of the pattern having regularly arranged holes M, a random pattern may be employed to prevent the moiré phenomenon.

In order to ensure both the electromagnetic-wave shielding function and the light transmittance, the ratio of open area to the projected area (hereinafter, referred to as "open area ratio") of the conductive mesh member is preferably in a range from 20% to 90%.

The transparent substrate film to which the metal foil such as the copper foil 11 is bonded may be a resin film as will be described below, besides the PET film 13, as a transparent substrate material to be used in the electromagnetic-wave shielding and light transmitting plate of the present invention. Preferable examples include PET, PBT (polybutylene terephthalate), PC, PMMA, and acrylic film. The thickness of the film is preferably set in a range from 1 μm to 200 μm to prevent the thickness of the resultant electromagnetic-wave shielding and light transmitting plate from being too thick and to ensure its enough durability and its easy handling.

As the transparent adhesive agent bonding the transparent substrate film and the metal foil, EVA or PVB resin as the adhesive resin to be used in the electromagnetic-wave shielding and light transmitting plate as will be described below may be employed. The method of forming the resin into sheet and the bonding method and its condition may be the same as the adhesive resin to be used in the electromagnetic-wave shielding and light transmitting plate. In addition, a transparent adhesive agent of epoxy resin series, acrylic resin series, urethane resin series, polyester resin series, or rubber series may also be employed. In view of etching resistance during the etching process after lamination, urethane resin series and epoxy resin series are particularly preferable. The thickness of the adhesive layer of the transparent adhesive agent 14 is preferably in a range from 1 μm to 50 μm. The transparent adhesive agent 14 may contain conductive particle as will be described later if required.

Figure 1:
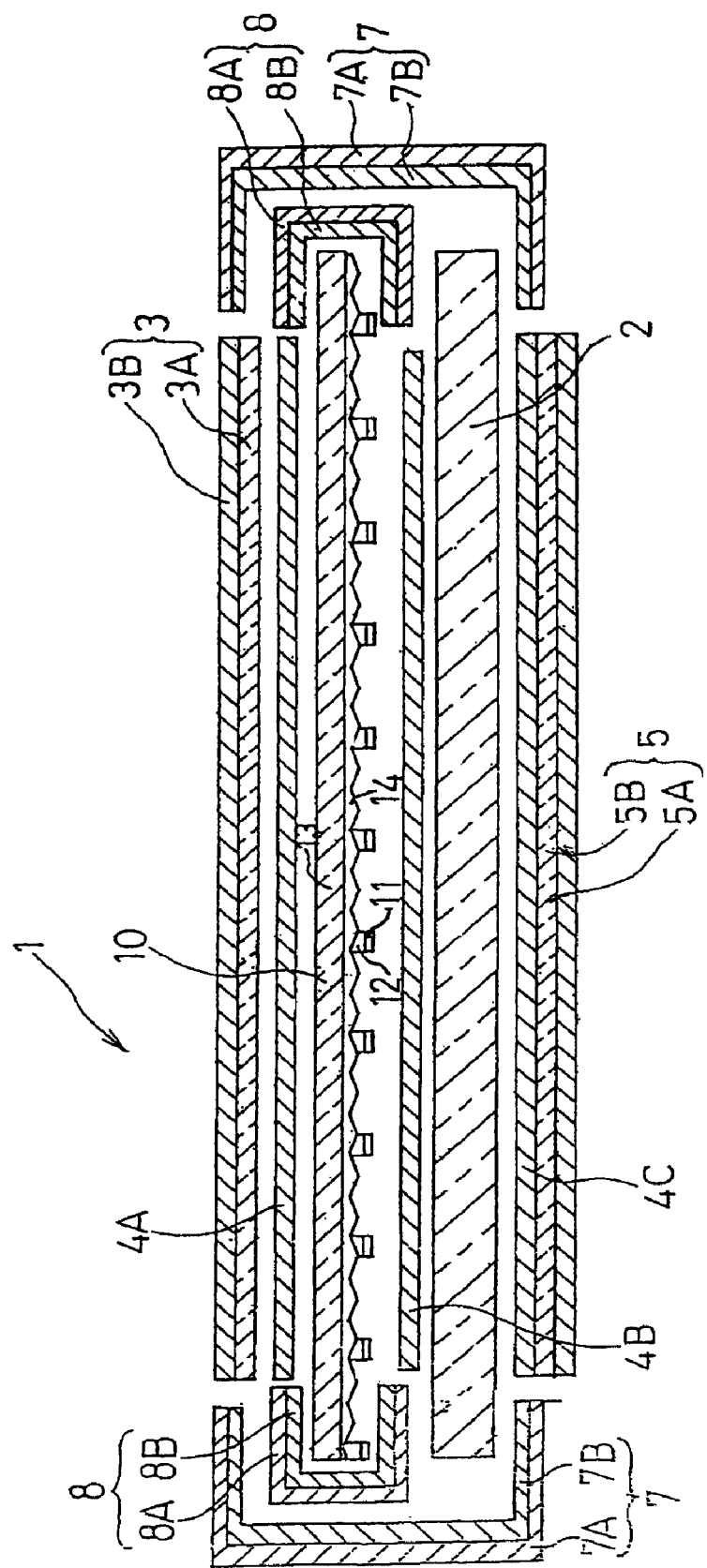
FIG. 1 is a schematic sectional view showing an embodiment of an electromagnetic-wave shielding and light transmitting plate according to the first aspect.
Figure 2:
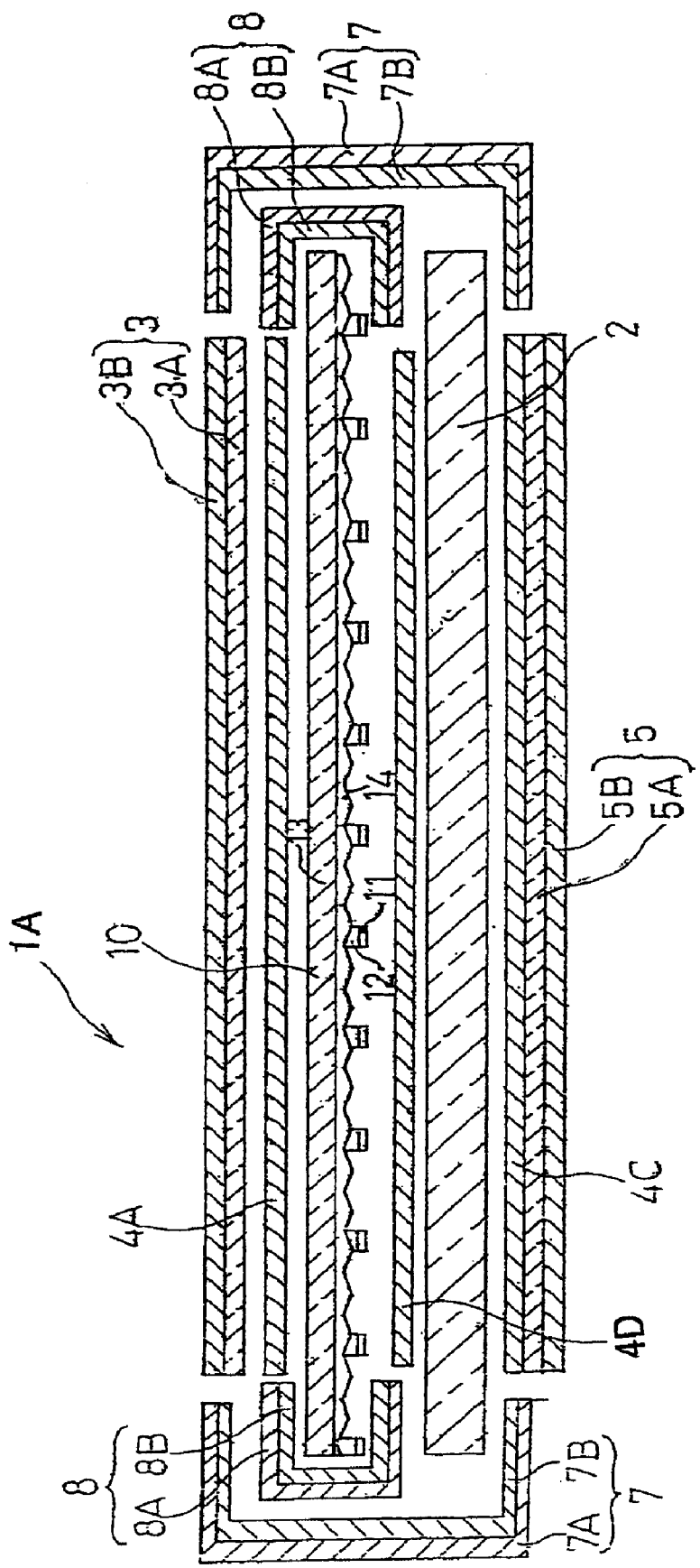
FIG. 2 is a schematic sectional view showing another embodiment of an electromagnetic-wave shielding and light transmitting plate according to the first aspect.

With reference to FIGS. 1 and 2, embodiments of the electromagnetic-wave shielding and light transmitting plate according to the first aspect will be described in detail.

FIGS. 1 and 2 are schematic sectional views showing embodiments of the electromagnetic-wave shielding and light transmitting plates according to the first aspect of the present invention.

The electromagnetic-wave shielding and light transmitting plate 1 of FIG. 1 comprises an antireflection film 3 as the front-most layer, a copper/PET laminated etched film 10 as the electromagnetic-wave shielding film, a transparent substrate 2, and a near-infrared ray blocking film 5 as the rear-most layer, wherein they are laminated and united by using intermediate adhesive layers 4A, 4B and pressure-sensitive adhesive 4C so as to form a laminated body. A conductive sticky tape 7 (hereinafter, referred to as "second conductive sticky tape") is bonded to cover the peripheral ends of the laminated body and margins along the edges of the front surface and the rear surface thereof near the peripheral ends thereof. The size of the electromagnetic-wave shielding film 10 is substantially equal to the size of the transparent substrate 2 and a conductive sticky tape 8 (hereinafter, referred to as "first conductive sticky tape") is bonded to and wound around the peripheral ends of the electromagnetic-wave shielding film 10 to extend from one surface to the other surface of the electromagnetic-wave shielding film 10.

An electromagnetic-shielding and light transmitting plate 1A of FIG. 2 has the same structure as the electromagnetic-shielding and light transmitting plate of FIG. 1 except that transparent pressure-sensitive adhesive 4D is used instead of the intermediate adhesive layer 4B.

The electromagnetic-shielding and light transmitting plate 1A of FIG. 2 comprises an antireflection film 3 as the front-most layer, a copper/PET laminated etched film 10 as the electromagnetic-wave shielding film, a transparent substrate 2, and a near-infrared ray blocking film 5 as the rear-most layer, wherein they are laminated and united by using an intermediate adhesive layer 4A, transparent pressure-sensitive adhesive 4D, and pressure-sensitive adhesive 4C so as to form a laminated body. A conductive sticky tape 7 (second conductive sticky tape) is bonded to cover the peripheral ends of the laminated body and margins along the edges of the front surface and the rear surface thereof near the peripheral ends thereof. The size of the electromagnetic-wave shielding film 10 is substantially equal to the size of the transparent substrate 2 and a conductive sticky tape 8 (first conductive sticky tape) is bonded to and wound around the peripheral ends of the electromagnetic-wave shielding film 10 to extend from one surface to the other surface of the electromagnetic-wave shielding film 10.

In FIGS. 1 and 2, the first conductive sticky tape 8 is preferably arranged all around the peripheries of the electromagnetic-wave shielding film 10. However, the first conductive sticky tape may be arranged partially, for example, may be arranged only on two peripheries opposite to each other.

In the electromagnetic-wave shielding and light transmitting plate 1, 1A, the antireflection film 3 and the intermediate adhesive layer 4A under the antireflection film 3 are slightly smaller than the electromagnetic-wave shielding film 10 and the transparent substrate 2 so that the peripheries of the antireflection film 3 and the intermediate adhesive layer 4A are slightly (preferably by 3-20 mm, particularly 5-10 mm) back off from the peripheries of the electromagnetic-wave shielding film 10 or the transparent substrate 2 so that the first conductive sticky tape 8 arranged around the peripheries of the electromagnetic-wave shielding film 10 is not covered by the antireflection film 3 or the intermediate adhesive layer 4A. Therefore, the second conductive sticky tape 7 is directly attached to the first conductive sticky tape 8, thereby securing the electric continuity of the electromagnetic-wave shielding film 10 through the first and second conductive sticky tapes 8, 7.

The near-infrared ray blocking film 5 with the pressure-sensitive adhesive 4C is also slightly smaller than the transparent substrate 2 so that the peripheries of the near-infrared ray blocking film 5 with the pressure-sensitive adhesive 4C are slightly (preferably by 3-20 mm, particularly 5-10 mm) back off from the peripheries of the transparent substrate 2.

In these embodiments, none of the peripheries of the antireflection film 3, the intermediate adhesive layer 4A, and the near-infrared ray blocking film 5 with the pressure-sensitive adhesive 4C is covered by the second conductive sticky tape 7. However, these may be located inside of and covered by the second conductive sticky tape 7. In the electromagnetic-wave shielding and light transmitting plates 1 and 1A of FIGS. 1 and 2, it is necessary to establish the electric continuity between the first conductive sticky tape 8 and the second conductive sticky tape 7. Therefore, the antireflection film 3 and the intermediate adhesive layer 4A must be smaller than the electromagnetic-wave shielding film 10 and the transparent substrate 2 so that their peripheries are thus back off from the peripheries of the electromagnetic-wave shielding film 10 or the transparent substrate 2. On the other hand, the near-infrared ray blocking film 5 with the pressure-sensitive adhesive 4C may have the same size as the transparent substrate 2.

It is preferable that all peripheries of the antireflection film 3 and the intermediate adhesive layer 4A are preferably back off from the peripheries of the electromagnetic-wave shielding film 10 or the transparent substrate 2. However, when the first conductive sticky tape 8 is attached to only a part of the peripheries, for example, two peripheries opposite to each other, only the corresponding peripheries of the antireflection film 3 and the intermediate adhesive layer 4A may be back off from the corresponding peripheries of the electromagnetic-wave shielding film 10 or the transparent substrate 2 and the second conductive sticky tape 7 may be attached to only the corresponding peripheries.

Examples of material of the transparent substrate 2 include glass, polyester, polyethylene terephthalate (PET), polybutylene terephthalate, polymethyl methacrylate (PMMA), acrylic board, polycarbonate (PC), polystyrene, triacetate film, polyvinyl alcohol, polyvinyl chloride, polyvinylidene chloride, polyethylene, ethylene-vinyl acetate copolymer, polyvinylbutyral, metal ionic cross-linked ethylene-meth-acrylic acid copolymer, polyurethane, and cellophane. Among these examples, glass, PET, PC, and PMMA are preferable.

The thickness of the transparent substrate 2 may be suitably determined in accordance with requirements (e.g. strength, light weight) due to the application of the plate and is normally preferably in a range from 0.1 to 10 mm, particularly 1 to 4 mm.

Acrylic resin-based black painting may be provided in a flame shape on the peripheral portion of the transparent substrate 2.

The transparent substrate 2 may be subjected to heat ray reflection coating such as metallic thin layer or transparent conductive layer to improve its function.

The antireflection film 3 may have a base film 3A having a thickness of 25-250 μm such as PET, PC, and PMMA and an antireflection layer 3B formed thereon. The antireflection layer 3B may be a single layer or laminated layers consisting of a high-refractive transparent layer and a low-refractive transparent layer. An example of the single layer is the following (1) and examples of the laminated layers are the following (2)-(5):

(1) a layer consisting of a lower-refractive transparent layer than the base film 3A;

(2) laminated layers consisting of a high-refractive transparent layer and a low-refractive transparent layer, i.e. two layers in amount;

(3) laminated layers consisting of two high-refractive transparent layers and two low-refractive transparent layers which are alternately laminated, i.e. four layers in amount;

(4) laminated layers consisting of a medium-refractive transparent layer, a high-refractive transparent layer, and a low-refractive transparent layer which are laminated in this order, i.e. three layers in amount; and (5) laminated layers consisting of three high-refractive transparent layers and three low-refractive transparent layers which are alternately laminated, i.e. six layers in amount.

The high-refractive transparent layer is a thin layer, preferably a transparent conductive layer, having a refractive index not lower than 1.8 consisting of ITO (tin indium oxide), ZnO, or Al-doped ZnO, $TiO_2$, $SnO_2$, or ZrO. The high-refractive transparent layer may be made by dispersing particles of any aforementioned material into acrylic binder or polyester binder.

The low-refractive transparent layer can be made of low-refractive material having a refractive index not greater than 1.6 such as $SiO_2$, $MgF_2$, or $Al_2O_3$. The low-refractive transparent layer may consist of organic material such as silicone or fluorine.

The thickness of each layer may be determined according to the film structure, the film kind, and the central wavelength because the refractive index in a visible-light range is reduced by interference of light. In case of four-layer structure, the antireflection film may have the first layer (high-refractive transparent layer) of 5 to 50 nm, the second layer (low-refractive transparent layer) of 5 to 50 nm, the third layer (high-refractive transparent layer) of 50 to 100 nm, and the fourth layer (low-refractive transparent layer) of 50 to 150 nm in thickness.

The antireflection film 3 may be further have an antifouling layer to improve the fouling resistance of the surface. The antifouling layer is preferably a fluorocarbon or silicone layer having a thickness in a range from 1 to 100 nm.

The near-infrared ray blocking film 5 has a base film 5A and a coating layer or a multi coating layer 5B on the surface of the base film 5A. The coating layer 5B may be made of a near infrared ray absorbing material such as copper inorganic material, copper organic material, cyanine, phthalocyanine, nickel complex, diimmonium. The multi coating layer 5B may consist of an inorganic dielectric material such as zinc oxide or ITO (tin indium oxide) and a metal such as silver. The base film 5A may be made of PET, PC, PMMA or the like. The thickness of the base film 5A is preferably in a range between 10 μm and 1 mm to prevent the thickness of the resultant electromagnetic-wave shielding and light transmitting plate from being too thick to ensure its easy handling and its durability. The thickness of the near-infrared ray blocking layer 5B, which is formed on the base film 5A, is usually from 0.5 to 50 μm.

The near-infrared ray blocking layer may be made of two or more of different materials or made by mixing or laminating two or more of coating layers. Two near-infrared ray blocking layers may be formed on the both surface of the base film. Two or more of near-infrared ray blocking layers may be laminated.

Not to lose the transparency and to obtain good near infrared ray blocking capability (for example, absorbing sufficiently near infrared rays in a wide near infrared wave-length range of 850 to 1,250 nm), it is preferable to use a combination of two or more of near-infrared ray blocking materials of different near-infrared ray blocking types as follows:

(a) a coating layer made of ITO having a thickness from 100 Å to 5000 Å;

(b) a coating layer made of an alternative lamination of ITO and silver having a thickness from 100 Å to 10000 Å;

(c) a coating layer having a thickness from 0.5 to 50 microns and containing a mixture of a nickel complex and immonium which is prepared with using a suitable transparent binder;

(d) a coating layer having a thickness from 10 to 10000 microns made by forming a film from a copper compound including bivalent copper ion with a suitable transparent binder; and (e) a coating layer having a thickness from 0.5 to 50 microns made of organic pigment.

Among these, it is preferable, but not limited to, to use
a combination of (a) and (c),
a combination of (a) and (d),
a combination of (b) and (c),
a combination of (b) and (d), or
(c) alone.

According to the present invention, in addition to the near-infrared ray blocking film 5, a transparent conductive film may be laminated. In this case, as the transparent conductive film, a resin film in which conductive particles are dispersed or a base film on which a transparent conductive layer is formed may be employed.

The conductive particles to be contained in the film may be any particles having conductivity and the following are examples of such conductive particles.

(i) carbon particles or powder;

(ii) particles or powder of metal such as nickel, indium, chromium, gold, vanadium, tin, cadmium, silver, platinum, aluminum, copper, titanium, cobalt, or lead, alloy thereof, or conductive oxide thereof;

(iii) particles made of plastic such as polystyrene and polyethylene, which are surfaced with coating layer of a conductive material from the above (i) and (ii); and (iv) a body formed by alternatively laminating ITO and silver.

Because the conductive particles of too large particle diameter affect the light transparency and the thickness of the transparent conductive film, it is preferable that the particle diameter is 0.5 mm or less. The preferable particle diameter of the conductive particles is between 0.01 and 0.5 mm.

Too high mixing ratio of the conductive particles in the transparent conductive film spoils the light transparency, while too low mixing ratio makes the electromagnetic-wave shielding function poor. The mixing ratio of the conductive particles is therefore preferably between 0.1 and 50% by weight, particularly between 0.1 and 20% by weight and more particularly between 0.5 and 20% by weight, relative to the resin of the transparent conductive film.

The color and the luster of the conductive particles can be suitably selected according to the application. In a case of a filter for a display panel, conductive particles having a dark color such as black or brown and dull surfaces are preferable. In this case, the conductive particles can suitably adjust the light transmittance of the filter so as to make the display easy-to-see.

Such a transparent conductive layer on the base film may be made of tin indium oxide, zinc aluminum oxide, or the like by one of methods including vapor deposition, sputtering, ion plating, and CVD (chemical vapor deposition). In this case, when the thickness of the transparent conductive layer is less than 0.01 μm, sufficient electromagnetic-wave shielding function can not be obtained, because the thickness of the conductive layer for the electromagnetic-wave shielding is too thin, and when exceeding 5 μm, light transparency may be spoiled.

Examples of the matrix resin of the transparent conductive film or the resin of the base film include polyester, PET, polybutylene terephthalate, PMMA, acrylic board, PC, polystyrene, triacetate film, polyvinyl alcohol, polyvinyl chloride, polyvinylidene chloride, polyethylene, ethylene-vinyl acetate copolymer, polyvinylbutyral, metal ionic cross-linked ethylene-methacrylic copolymer, polyurethane, and cellophane. Preferably selected from the above resins are PET, PC, and PMMA.

The thickness of the transparent conductive film is normally preferably in a range from 1 μm to 5 mm.

Preferably used as thermosetting adhesive resin forming the intermediate adhesive layers 4A, 4B of the electromagnetic-wave shielding and light transmitting plate 1 of FIG. 1 for bonding the antireflection film 3, the electromagnetic-wave shielding film 10, and the transparent substrate 2 or forming the intermediate adhesive layer 4A of the electromagnetic-wave shielding and light transmitting plate 1A of FIG. 2 is transparent and elastic adhesive resin as ordinarily used for laminated glass. Particularly, because the intermediate adhesive layers 4A, 4B are positioned ahead of the transparent substrate 2, the elastic resin preferably having high elasticity and thus having high capability of preventing the scattering of fragments is effectively used.

Examples of adhesive resins having such high elasticity include copolymers of ethylene group, such as ethylene-vinyl acetate copolymer, ethylene-methyl acrylate copolymer, ethylene-(meth) acrylic acid copolymer, ethylene-ethyl (meth) acrylic acid copolymer, ethylene-methyl (meth) acrylic acid copolymer, metal ionic cross-linked ethylene-(meth) acrylic acid copolymer, partial saponified ethylene-vinyl acetate copolymer, calboxylated ethylene-vinyl acetate copolymer, ethylene-(meth) acrylic-maleic anhydride copolymer, and ethylene-vinyl acetate-(meth) acrylate copolymer. It should be noted that "(meth) acrylic" means "acrylic or methacrylic". Besides the above resins, polyvinyl butyral (PVB) resin, epoxy resin, acrylic resin, phenol resin, silicone resin, polyester resin, or urethane resin may also be employed. Ethylene-vinyl acetate copolymer (EVA) can offer the best balance of performance and is easy to be handled. In terms of the impact resistance, the perforation resistance, the adhesive property, and the transparency, PVB resin often used for laminated safety glasses for automobile is also preferable.

It is preferable that the PVB resin contains polyvinyl acetal between 70 and 95% by unit weight and polyvinyl acetate between 1 and 15% by unit weight, and has an average degree of polymerization between 200 and 3000, preferably 300 and 2500. The PVB resin is used as resin composition containing plasticizer.

Examples of plasticizer in the PVB resin composition include organic plasticizers, such as monobasic acid ester and polybasic acid ester, and phosphoric acid plasticizers.

Preferable examples of such monobasic acid ester are ester as a result of reaction of organic acid, such as butyric acid, isobutyric acid, caproic acid, 2-ethylbutyric acid, heptoic acid, n-octyl acid, 2-ethylhexyl acid, pelargonic acid (n-nonyl acid), or decyl acid, and triethylene glycol and, more preferably, are triethylene-di-2-ethylbthyrate, triethylene glycol-di-2-ethylhexoate, triethylene glycol-di-caproate, and triethylene glycol-di-n-ocotoate. Ester of one of the above organic acids and tetraethylene glycol or tripropylene glycol may be also employed.

Preferable examples of plasticizers of polybasic acid ester group are ester of organic acid, such as adipic acid, sebacic acid, or azelaic acid, and straight chain like or brunch like alcohol with from 4 to 8 carbon atoms and, more preferably, are dibutyl sebacate, dioctyl azelate, and dibutyl carbitol adipate.

Examples of phosphoric acid plasticizers include tributoxyethyl phosphate, isodecyl phenyl phosphate, and tri-isopropyl phosphate.

Insufficient plasticizer in the PVB resin composition reduces the film-forming property, while excessive plasticizer spoils the durability during high temperature. Therefore, the amount of plasticizer in the PVB resin composition is between 5 and 50 parts by weight, preferably between 10 and 40 parts by weight, per 100 parts by weight of polyvinyl butyral resin.

The PVB resin composition may further include another additive agent for preventing degradation such as stabilizer, antioxidant, and ultraviolet absorbing agent.

The adhesive resin for the intermediate adhesive layers 4A, 4B is preferably cross-linked thermosetting resin containing cross linking agent, especially preferably cross-linked EVA (ethylene-vinyl acetate copolymer).

Hereinafter, the cross-linked EVA as the adhesive resin will be described in detail.

As EVA, EVA including vinyl acetate in an amount of 5-50% by weight, preferably 15-40% by weight, is employed. Less than 5% by weight of vinyl acetate interferes with the weatherability and the transparency, while exceeding 40% by weight of vinyl acetate significantly reduces mechanical characteristics, makes the film formation difficult, and produces a possibility of blocking between films.

As the crosslinking agent, organic peroxide is preferable. The organic peroxide is selected according to the temperature for sheet process, the temperature for crosslinking, and the storage stability. Examples of available peroxide include 2,5-dimethylhexane-2,5-dihydro peroxide; 2,5-dimethyl-2,5-di(t-butyl-peroxy)-hexane-3; di-t-butyl peroxide; t-butylcumyl peroxide; 2,5-dimethyl-2,5-di(t-butyl-peroxy)-hexane; dicumyl peroxide; α,α'-bis(t-butyl peroxy isopropyl)-benzene; n-buthyl-4,4-bis(t-butyl-peroxy)-valerate; 2,2-bis(t-butyl-peroxy)-butane, 1,1-bis(t-butyl-peroxy)-cyclohexane; 1,1-bis(t-butyl-peroxy)-3,3,5-trimethylcyclohexane; t-butyl peroxy benzoate; benzoyl peroxide; tert-butyl peroxy acetate; 2,5-dimethyl-2,5-bis(tert-butyl-peroxy)-hexyne-3; 1,1-bis(tert-butyl-peroxy)-3,3,5-trimethylcyclohexane; 1,1-bis(tert-butyl-peroxy)-cyclohexane; methyl ethyl ketone peroxide; 2,5-dimethylhexyl-2,5-bis-peroxy-benzoate; tert-butyl-hydroperoxide; p-menthane hydroperoxide; p-chlorbenzoyl peroxide; tert-butyl peroxyisobutyrate; hydroxyheptyl peroxide; and chlorohexanone peroxide. These are used alone or in mixed state, normally less than 10 parts by weight, preferably from 0.1 to 10 parts by weight per 100 parts by weight of EVA.

The organic peroxide is normally mixed to the EVA by an extruder or a roll mill or may be added to the EVA film by means of impregnation by dissolving the peroxide into organic solvent, plasticizer, or vinyl monomer.

In order to improve the properties of the EVA (such as mechanical strength, optical property, adhesive property, weatherability, blushing resistance, and crosslinking rate), a compound containing acryloxy group or methacryloxy group and allyl group may be added into the EVA. Such a compound used for this purpose is usually acrylic acid or methacrylic acid derivative, for example, ester or amide thereof. Examples of ester residues include alkyl group such as methyl, ethyl, dodecyl, stearyl, and lauryl and, besides such alkyl group, cycloxyhexyl group, tetrahydrofurfuryl group, aminoethyl group, 2-hydroethyl group, 3-hydroxypropyl group, and 3-chloro-2-hydroxypropyl group. Ester with polyfunctional alcohol such as ethylene glycol, triethylene glycol, polyethylene glycol, trimethylolpropane, or pentaerythritol may also be employed. The typical amide is diacetone acrylamide.

More concretely, examples include compounds containing polyfunctional ester such as acrylic or methacrylic ester such as trimethylolpropane, pentaerythritol and glycerin, or containing allyl group such as triallyl cyanurate, triallyl isocyanurate, diallyl phthalate, diallyl isophthalate, and diallyl maleate. These are used alone or in the mixed state, normally from 0.1 to 2 parts by weight, preferably from 0.5 to 5 parts by weight per 100 parts by weight of EVA.

Figure 5:
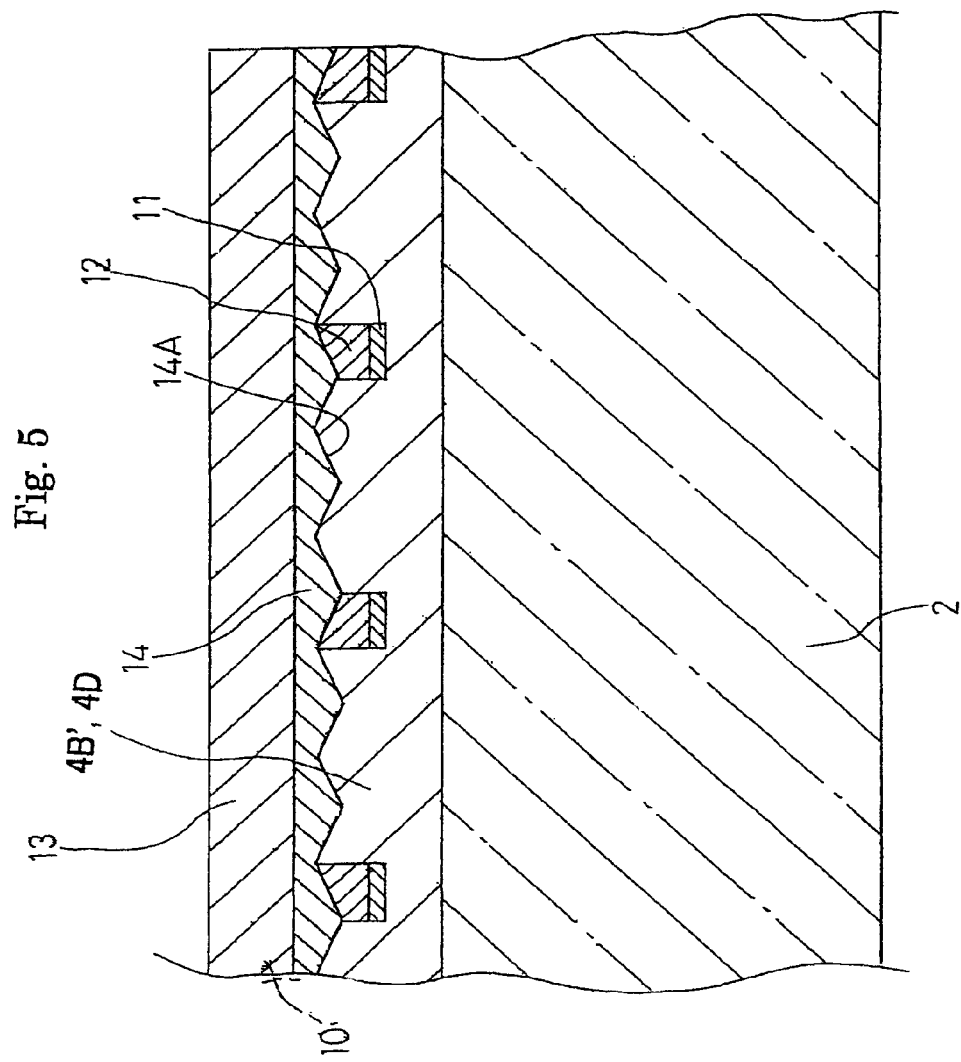
FIG. 5 is an enlarged sectional view for explaining a bonding portion between the electromagnetic-wave shielding film and a transparent substrate of the electromagnetic-wave shielding and light transmitting plate of FIG. 1.

In case of the electromagnetic-wave shielding and light transmitting plate 1 of FIG. 1 when such cross-linked EVA is used, the electromagnetic-wave shielding film 10 and the transparent substrate 2 are laminated and temporally bonded via the intermediate adhesive layer 4B with some pressure (this temporal adhesion allows re-adhesion, if necessary) and after that are pressurized and heated, thereby bonding the electromagnetic-wave shielding film 10 and the transparent substrate 2 with no air bubbles being captured therebetween as shown in FIG. 5. Therefore, the adhesive resin 4B' of the intermediate adhesive layer 4B can intrude the small irregularities in the surface 14A of the transparent adhesive agent 14 of the electromagnetic-wave shielding film 10 so that the small irregularities are completely filled with the adhesive resin 4B', thereby advantageously securely preventing light scattering due to the irregularities.

To further securely prevent the light scattering due to the small irregularities in the surface 14A of the transparent adhesive agent 14 of the electromagnetic-wave shielding film 10 by means of the adhesive resin 4B' of the intermediate adhesive layer 4B, it is preferable that the refractive index of the transparent adhesive agent 14 is set to be substantially equal to the refractive index of the adhesive resin 4B' after hardened so as to prevent reflection of light between the boundary faces of the transparent adhesive agent 14 and the adhesive resin 4B'.

Since the refractive index of the EVA as the adhesive resin 4B' is on the order of n=1.5, a transparent adhesive agent having a refractive index on the order of n=1.5 is preferably employed as the transparent adhesive agent 14. Besides the resin-type adhesive agent such as EVA or PVB, a transparent adhesive agent of epoxy series, acrylic series, urethane series, polyester series, or rubber series may also be employed as the transparent adhesive agent 14.

The thickness of each intermediate adhesive layer 4A, 4B is preferably in a range from 10 to 1000 μm.

The intermediate adhesive layers 4A, 4B may further include, in small amounts, ultraviolet ray absorbing agent, infrared ray absorbing agent, antioxidant, and/or paint processing aid. For adjusting the color of the filter itself, they may further include coloring agent such as dye and pigment, and/or filler such as carbon black, hydrophobic silica, and calcium carbonate.

It is also effective that the intermediate adhesive layers in sheet condition are surfaced by corona discharge process, low temperature plasma process, electron beam irradiation process, or ultraviolet irradiation process as measures of improving the adhesive property.

The intermediate adhesive layers can be manufactured by first mixing the adhesive resin and the additives listed above, kneading them by an extruder or a roll, and after that, forming in a predetermined configuration by means of a film forming method such as calendering, rolling, T-die extrusion, or inflation. During the film formation, embossing is provided for preventing the blocking between sheets and facilitating the deaerating during compressed onto the transparent base plate.

As another adhesive agent, pressure-sensitive adhesive as will be described below may also be suitably employed as the intermediate adhesive layer 4A.

As the transparent self-adhesive 4D of the electromagnetic-wave shielding and light transmitting plate 1A of FIG. 2, transparent pressure-sensitive adhesive may be employed. For example, acrylic adhesives, and thermoplastic elastomers such as SBS and SEBS may also be suitably employed. Such pressure-sensitive adhesives may further suitably include tackifier, ultraviolet ray absorbing agent, coloring pigment, coloring dye, antioxidant, and/or sticking aid.

In case of using such transparent pressure-sensitive adhesive 4D, the electromagnetic-wave shielding film 10 and the transparent substrate 2 are laminated and temporally bonded via the transparent pressure-sensitive adhesive 4D with some pressure (this temporal adhesion allows re-adhesion, if necessary) and after that are pressurized and heated or depressurized and heated, thereby bonding the electromagnetic-wave shielding film 10 and the transparent substrate 2 with no air bubbles being captured therebetween as shown in FIG. 5. Therefore, the transparent pressure-sensitive adhesive 4D can intrude the small irregularities in the surface 14A of the transparent adhesive agent 14 of the electromagnetic-wave shielding film 10 so that the small irregularities are completely filled with the transparent pressure-sensitive adhesive 4D, thereby advantageously securely preventing light scattering due to the irregularities.

The transparent pressure-sensitive adhesive 4D allows re-adhesion and can bond strongly the electromagnetic-wave shielding film 10 and the transparent substrate 2 together without capturing air bubbles between their boundary faces.

It is preferable that the transparent pressure-sensitive adhesive 4D is directly applied to a conductive foil surface pattern-etched on the electromagnetic-wave shielding film 10.

To further securely prevent the light scattering due to the small irregularities in the surface 14A of the transparent adhesive agent 14 of the electromagnetic-wave shielding film 10 by means of the transparent pressure-sensitive adhesive 4D, it is preferable that the refractive index of the transparent adhesive agent 14 is set to be substantially equal to the refractive index of the transparent pressure-sensitive adhesive 4D so as to prevent reflection of light between the boundary faces of the transparent adhesive agent 14 and the transparent pressure-sensitive adhesive 4D.

Since the refractive index of the acrylic series, urethane series, EVA series, PVB series, silicone series, and rubber series as the transparent pressure-sensitive adhesive or adhesive agent 4D is generally on the order of n=1.5, a transparent adhesive agent having a refractive index on the order of n=1.5 is preferably employed as the transparent adhesive agent 14. The transparent adhesive agent 14 having such a refractive index may be of acrylic series, urethane series, and rubber series. In case of using epoxy series, polyester series as the transparent pressure-sensitive adhesive or adhesive agent 4D, since the refractive index of the epoxy series and polyester series is on the order of n=1.6-1.65, an adhesive agent having a refractive index on the order of n=1.6-1.65 is preferably employed as the transparent adhesive agent 14. The transparent adhesive agent 14 having such a refractive index may be of epoxy series and polyester series.

The electromagnetic-wave shielding film 10 may be directly bonded to the transparent substrate 2 as shown in FIG. 1 and FIG. 2 and may be bonded to the transparent substrate 2 via another film.

Examples listed above as the transparent pressure-sensitive adhesive 4D may be employed as the pressure-sensitive adhesive 4C of the near-infrared ray blocking film 5. The transparent pressure-sensitive adhesive 4D or the pressure-sensitive adhesive 4C may be previously applied on the electromagnetic-wave shielding film 10 or the near-infrared ray blocking film 5 to have a thickness of 5-100 μm by coating or lamination and, after that, the electromagnetic-wave shielding film 10 or the near-infrared ray blocking film 5 may be attached to the transparent substrate or another film.

The near-infrared ray blocking film 5 is preferably laminated on the transparent substrate 2 by using the pressure-sensitive adhesive 4C. This is because the near-infrared ray blocking film 5 is sensitive to heat so as not to withstand heat at temperature for crosslinking (130-150° C.). Low-temperature crosslinkable EVA (the temperature for crosslinking on the order of 70-130° C.) can be used for bonding the near-infrared ray blocking film 5 to the transparent substrate 2.

Each second and first conductive sticky tape 7, 8 is formed, as shown in FIGS. 1 and 2, by laying a conductive pressure-sensitive adhesive layer 7B, 8B, in which conductive particles are dispersed, on one surface of a metal foil 7A, 8A. The pressure-sensitive adhesive layers 7B, 8B may be acrylic adhesive, rubber adhesive, silicone adhesive, or epoxy or phenolic resin containing hardener.

Conductive materials of any type having good electrical continuities may be employed as the conductive particles to be dispersed in the pressure-sensitive adhesive layers 7B, 8B. Examples include metallic powder of, for example, copper, silver, and nickel, and resin or ceramic powder coated with such a metal as mentioned above. There is no specific limitation on its configuration so that the particles may have any configuration such as scale-like, dendritic, granular, or pellet-like configuration.

The content of the conductive particles is preferably 0.1-15% by volume relative to the polymer composing the pressure-sensitive adhesive layers 7B, 8B and the average particle size is preferably 0.1-100 μm. By limiting the content and the particle size as mentioned above, the conductive particles are prevented from being agglomerated, thereby obtaining good conduction.

The metal foils 7A, 8A as the substrates of the conductive sticky tapes 7, 8 may be made of metal such as copper, silver, nickel, aluminum, or stainless steel and normally has a thickness of 1-100 µm.

The pressure-sensitive adhesive layers 7B, 8B are made of mixture in which the aforementioned adhesive and conductive particles are mixed uniformly in a predetermined ratio, and can be easily formed by applying the mixture onto the metallic foil using a roll coater, a die coater, a knife coater, a micabar coater, a flow coater, a spray coater or the like.

The thickness of each pressure-sensitive adhesive layer 7B, 8B is normally in a range from 5 to 100 µm.

To manufacture the electromagnetic-wave shielding and light transmitting plate 1 as shown in FIG. 1, for example, the antireflection film 3, the electromagnetic-wave shielding film 10, the transparent substrate 2, the near-infrared ray blocking film 5 with the pressure-sensitive adhesive 4C, the intermediate adhesive layers 4A, 4B, and the first and second conductive sticky tapes 8, 7 are first prepared. The first conductive sticky tape 8 is previously bonded to the peripheries of the electromagnetic-wave shielding film 10. Then, the antireflection film 3, the electromagnetic-wave shielding film 10 with the first conductive sticky tape 8, and the transparent substrate 2 are laminated with the intermediate adhesive layers 4A, 4B interposed therebetween, respectively and then heated with being compressed under the hardening condition of the intermediate adhesive layers 4A, 4B to unite them. After that, the near-infrared ray blocking film 5 is laminated to the laminated body with the pressure-sensitive adhesive 4C. Then, the second conductive sticky tape 7 is attached to the peripheries of the laminated body and is bonded and fixed according to a hardening method, such as thermo compression bonding, suitable for the pressure-sensitive adhesive layers 7B, 8B of the employed conductive sticky tapes 7, 8.

To manufacture the electromagnetic-wave shielding and light transmitting plate 1A as shown in FIG. 2, for example, the antireflection film 3, the electromagnetic-wave shielding film 10, the transparent substrate 2, the near-infrared ray blocking film 5 with the pressure-sensitive adhesive 4C, the intermediate adhesive layer 4A, the transparent pressure-sensitive adhesive 4D, and the first and second conductive sticky tapes 8, 7 are first prepared. The transparent pressure-sensitive adhesive 4D is previously applied to one surface of the electromagnetic-wave shielding film 10 and the first conductive sticky tape 8 is also previously bonded to the peripheries of electromagnetic-wave shielding film 10. Then, the electromagnetic-wave shielding film 10 with the first conductive sticky tape 8 and the transparent pressure-sensitive adhesive 4D thereon is laid on and bonded to the transparent substrate 2. After that, the antireflection film 3 is laid on the laminated body via the intermediate adhesive layer 4A, and they are heated with being compressed under the hardening condition of the intermediate adhesive layer 4A to unite them. After that, the near-infrared ray blocking film 5 is laid on and bonded to the laminated body with the pressure-sensitive adhesive 4C. Then, the second conductive sticky tape 7 is attached to the peripheries of the laminated body and is bonded and fixed according to a hardening method, such as thermo compression bonding or decompression heating, suitable for the pressure-sensitive adhesive layers 7B, 8B of the employed conductive sticky tapes 7, 8.

When cross-linkable conductive sticky tapes are used as the conductive sticky tapes 7, 8, the cross-linkable conductive sticky tapes are bonded to the electromagnetic-wave shielding film and the laminated body by tackiness of the pressure-sensitive adhesive layers 7B, 8B thereof (this temporal adhesion allows re-adhesion, if necessary) and then heated or radiated with ultraviolet with some pressures, if necessary. The ultraviolet radiation may be performed with heating. The cross-linkable conductive sticky tape may be partially bonded by partially heating or radiating ultraviolet.

The thermo compression bonding can be easily conducted by a normal heat sealer. As one of compression and heating methods, a method may be employed that the laminated body bonded with the cross-linkable conductive sticky tape is inserted into a vacuum bag which is then vacuumed and after that is heated. Therefore, the bonding operation is quite easy.

The bonding condition in case of thermal cross-linking depends on the type of crosslinking agent (organic peroxide) to be employed. The cross-linking is conducted normally at a temperature from 70 to 150° C., preferably from 70 to 130° C. and normally for 10 seconds to 120 minutes, preferably 20 seconds to 60 minutes.

In case of optical cross-linking, various light sources emitting in ultraviolet to visible range may be employed. Examples include an extra-high pressure, high pressure, or low pressure mercury lamp, a chemical lamp, a xenon lamp, a halogen lamp, a Mercury halogen lamp, a carbon arc lamp, an incandescent lamp, and a laser radiation. The period of radiation is not limited because it depends on the type of lamp and the strength of the light source, but normally in a range from dozens of seconds to dozens of minutes. In order to aid the cross-linking, ultraviolet may be radiated after previously heating to 40-120° C.

The pressure for bonding should be suitably selected and is preferably 5-50 kg/cm$^2$, particularly 10-30 kg/cm$^2$.

The electromagnetic-wave shielding and light transmitting plates 1, 1A with the conductive sticky tapes 7, 8 mentioned above can be quite easily built in a body of equipment and can provide good electric continuity between the electromagnetic-wave shielding film 10 and the body of equipment through the first and second conductive sticky tapes 7, 8 on four sides of the plate only by fitting into the body, thereby exhibiting high electromagnetic-wave shielding function. In addition, excellent near infrared ray blocking capability can be obtained because of the existence of the near-infrared ray blocking film 5. Further, since only a single piece of the transparent substrate 2 is used, the plate is thin and light. Since both the surfaces of the transparent substrate 2 are covered by the films 3, 5, respectively, the electromagnetic-wave shielding and light transmitting plate has an effect of preventing the transparent substrate 2 from being broken and an effect of preventing the scattering of broken pieces of the transparent substrate 2 even if broken.

Since the electromagnetic-wave shielding film 10 is formed by pattern-etching a conductive foil such as the copper foil 11, the design of the etching pattern can be suitably changed, whereby good electromagnetic-wave shielding property and good light transmitting function are both obtained and the moire phenomenon is prevented. The electromagnetic-wave shielding film 10 has the light absorbing layer 12 and has small irregularities formed in the surface of the light absorbing layer 12 by surface roughening. Further, irregularities in the transparent adhesive agent 14 formed by transfer of the small irregularities are filled with the transparent pressure-sensitive adhesive 4B, thereby providing high antireflection effect and obtaining a distinct image having high contrast.

The electromagnetic-wave shielding and light transmitting plates shown in FIGS. 1 and 2 have been described by way of example of electromagnetic-wave shielding and light transmitting plates according to the first aspect of the present invention and the present invention is not limited by the shown examples.

With reference to FIGS. 7A-7F, an exemplary method of manufacturing an electromagnetic-wave shielding film to be used in an electromagnetic-wave shielding and light transmitting plate of the second aspect of the present invention will be described.

Figure 7:
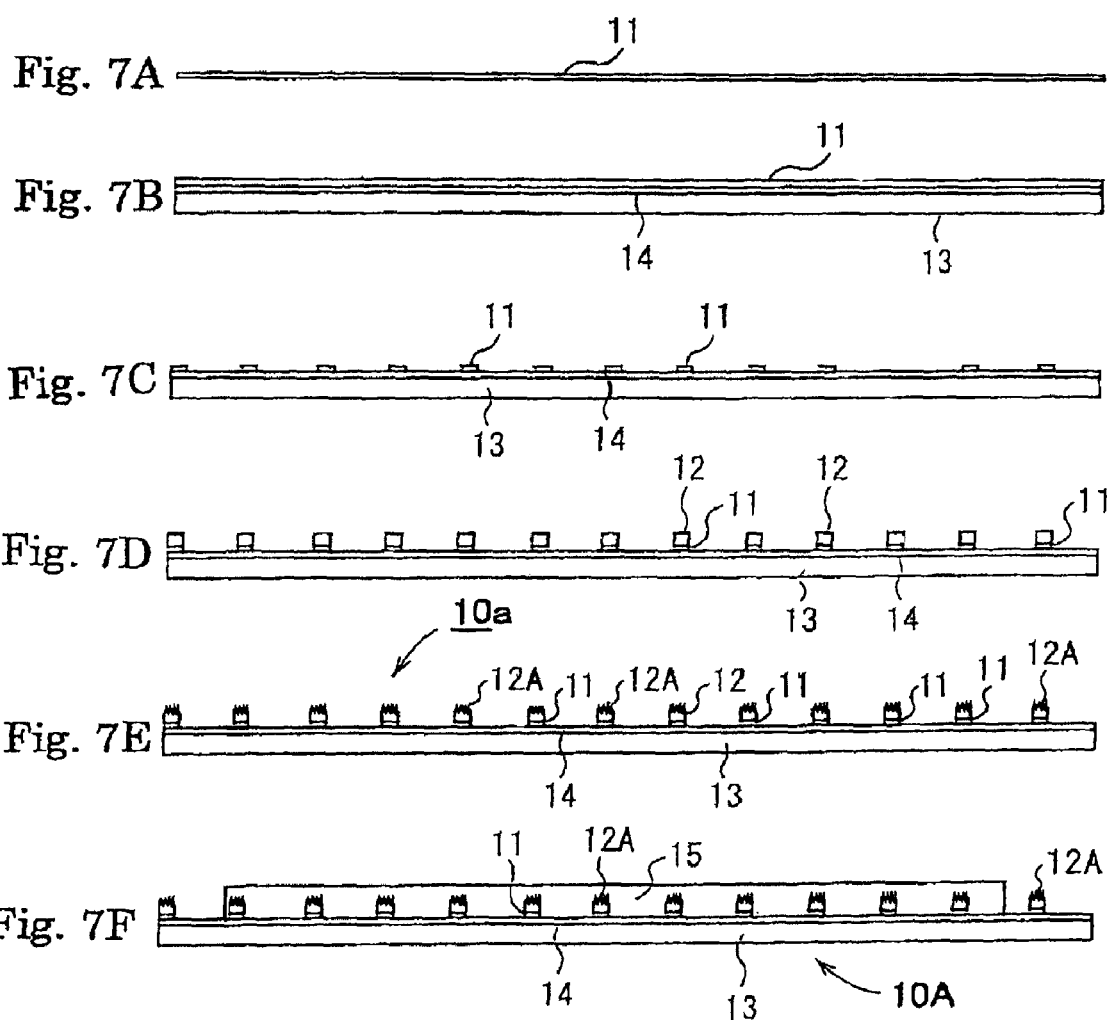
FIGS. 7A-7F are explanatory illustrations showing an exemplary method of manufacturing an electromagnetic-wave shielding film used in the second aspect.

For example, a copper foil 11 is prepared as a conductive foil (FIG. 7A) and the copper foil 11 is bonded to a transparent substrate such as a PET (polyethylene terephthalate) film 13 by a transparent adhesive agent 14 (FIG. 7B).

Pattern-etching is conducted on the thus obtained laminated film to partially remove the copper foil 11 (FIG. 7C).

Then, a light absorbing layer 12 is formed on the surface of the pattern-etched copper foil 11 (FIG. 7D). As a forming method of this light absorbing layer 12, there is a method of making a film of a copper alloy such as Cu—Ni and, after that, blackening a surface of the film by treatment with acid or alkali. The blackened surface subjected to this surface treatment is roughened. The surface roughness Rz can be controlled according to the treatment condition. Alternatively, the light absorbing layer 12 can be formed by applying a light absorbing ink onto the copper foil 11 and hardening the ink. Examples of the light absorbing ink used here include carbon ink, nickel ink, and inks such as dark color organic pigments. Then, the light absorbing layer 12 is subjected to a matting process to form small irregularities by mechanically roughening, for example, shot blasting the surface 12A thereof or chemically roughening the surface 12A using acid or alkali, alternatively, by applying the ink which is previously mixed with the inorganic or organic fine particles so as to form a film originally having roughened surface (FIG. 7E). The thickness of the light absorbing layer 12 varies depending on the blackening material and/or the conductivity, but it is preferable that the thickness is in a range from 1 nm to 10 μm in order to sufficient electromagnetic-wave shielding property without losing its conductivity. The level of roughness of the surface 12A is preferably in a range from 0.1 to 20 μm as surface roughness Rz in order to sufficiently prevent the light scattering with excellent antireflection efficiency.

After that, a transparent pressure-sensitive adhesive is applied on the copper-foil-side surface of the thus obtained copper/PET laminated etched film 10a so as to form a coating layer 15, thereby obtaining an electromagnetic-wave shielding film with pressure-sensitive adhesive layer 10A (FIG. 7F).

The kind, the thickness, the pattern etching method, and the etched pattern of the conductive foil composing the electromagnetic-wave shielding film are the same as those described with regard to the aforementioned method of manufacturing the electromagnetic-wave shielding film to be used in the electromagnetic-wave shielding and light transmitting plate of the first aspect.

The kind and the thickness of the transparent substrate film to which the metal foil such as the copper foil 11 is bonded and the transparent adhesive agent for bonding the transparent substrate film and the metal foil are also the same as mentioned above.

As the transparent pressure-sensitive adhesive forming the coating layer 15 on the copper/PET laminated etched film 10a, various transparent pressure-sensitive adhesive may be employed. For example, acrylic adhesives, and thermoplastic elastomers such as SBS and SEBS may be suitably employed. Such pressure-sensitive adhesives may further suitably include tackifier, ultraviolet ray absorbing agent, coloring pigment, coloring dye, antioxidant, and/or sticking aid.

It is preferable that the refractive index of the transparent adhesive agent 14 is substantially equal to the refractive index of the transparent pressure-sensitive adhesive of the coating layer 15 so as to prevent reflection of light between boundary faces of the transparent adhesive agent 14 and the transparent pressure-sensitive adhesive of the coating layer 15.

Since the refractive index of the acrylic series, silicone series as the transparent pressure-sensitive adhesive forming the coating layer 15 is generally on the order of n=1.5, a transparent adhesive agent having a refractive index on the order of n=1.5 is preferably employed as the transparent adhesive agent 14. Examples of the transparent adhesive agent 14 having such a refractive index include transparent adhesive agents of acrylic series, urethane series, and rubber series.

The thickness of the coating layer 15 made of the transparent pressure-sensitive adhesive is preferably in a range from 1 to 100 μm.

The coating layer 15 of the transparent pressure-sensitive adhesive is applied to expose the peripheries of the copper foil 11 to which a conductive sticky tape as will be described later is attached for manufacturing the electromagnetic-wave shielding and light transmitting plate.

Hereinafter, with reference to FIG. 6, an embodiment of the electromagnetic-wave shielding and light transmitting plate according to the second aspect will be described in detail.

Figure 6:
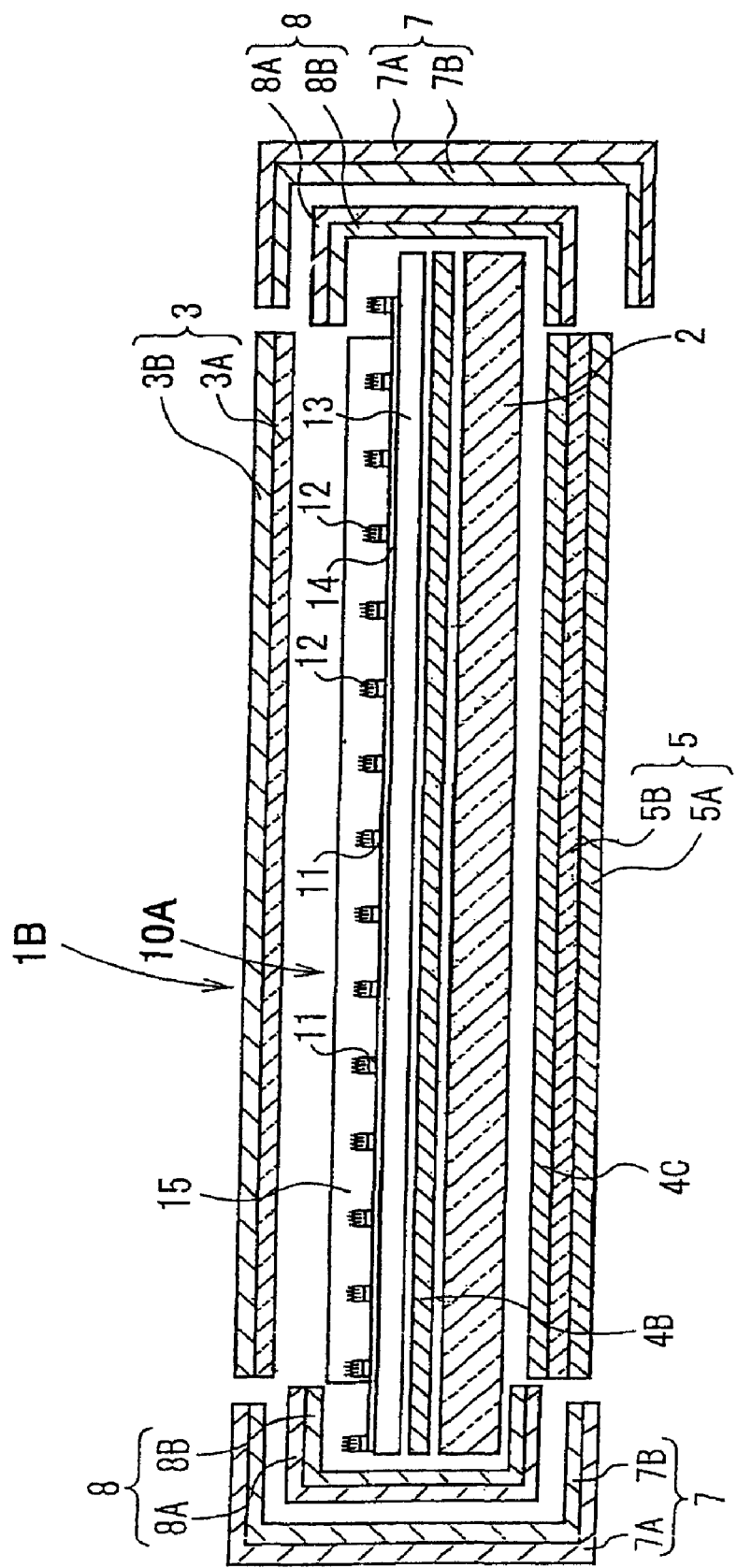
FIG. 6 is a schematic sectional view showing an embodiment of an electromagnetic-wave shielding and light transmitting plate according to the second aspect.

FIG. 6 is a schematic sectional view showing an embodiment of the electromagnetic-wave shielding and light transmitting plate according to the second aspect of the present invention.

The electromagnetic-wave shielding and light transmitting plate 1B of FIG. 6 comprises an antireflection film 3 as the front-most layer, an electromagnetic-wave shielding film with pressure-sensitive adhesive layer 10A, an intermediate adhesive layer 4B as adhesive agent, a transparent substrate 2, and a near-infrared ray blocking film 5 with a pressure-sensitive adhesive layer 4C as the rear-most layer, wherein they are laminated together to form a laminated body. A conductive sticky tape 7 (hereinafter, referred to as "second conductive sticky tape") is bonded to cover the peripheral ends of the laminated body and margins along the edges of the front surface and the rear surface thereof near the peripheral ends thereof to unite them. The size of the electromagnetic-wave shielding film with pressure-sensitive adhesive layer 10A is substantially equal to the size of the transparent substrate 2 and a conductive sticky tape 8 (hereinafter, referred to as "first conductive sticky tape") is bonded to and wound around the peripheral ends of the laminated body to extend from one surface to the other surface of the laminated body composed of the electromagnetic-wave shielding film with pressure-sensitive adhesive layer 10A, the intermediate adhesive layer 4B, and the transparent substrate 2. The first conductive sticky tape 8 is preferably arranged all around the peripheries of the electromagnetic-wave shielding film with pressure-sensitive adhesive layer 10A. However, the first conductive sticky tape may be arranged partially, for example, may be arranged only on two peripheries opposite to each other.

In the electromagnetic-wave shielding and light transmitting plate 1B, the antireflection film 3 is slightly smaller than the electromagnetic-wave shielding film with pressure-sensitive adhesive layer 10A or the transparent substrate 2 so that the peripheries of the antireflection film 3 are slightly (preferably by 3-20 mm, particularly 5-10 mm) back off from the peripheries of the electromagnetic-wave shielding film with pressure-sensitive adhesive layer 10A or the transparent substrate 2 so that the first conductive sticky tape 8 arranged around the peripheries of the electromagnetic-wave shielding film with pressure-sensitive adhesive layer 10A is not covered by the antireflection film 3. Therefore, the second conductive sticky tape 7 is directly attached to the first conductive sticky tape 8, thereby securing the electric continuity of the electromagnetic-wave shielding film with pressure-sensitive adhesive layer 10A through the first and second conductive sticky tapes 8, 7.

The near-infrared ray blocking film 5 with the pressure-sensitive adhesive 4C is also slightly smaller than the transparent substrate 2 so that the peripheries of the near-infrared ray blocking film 5 with the pressure-sensitive adhesive 4C are slightly (preferably by 3-20 mm, particularly 5-10 mm) back off from the peripheries of the transparent substrate 2.

In this embodiment, none of the peripheries of the antireflection film 3 and the near-infrared ray blocking film 5 with the pressure-sensitive adhesive 4C is covered by the second conductive sticky tape 7. However, these may be located inside of and covered by the second conductive sticky tape 7. In the electromagnetic-wave shielding and light transmitting plate 1B of FIG. 6, it is necessary to establish the electric continuity between the first conductive sticky tape 8 and the second conductive sticky tape 7. Therefore, the antireflection film 3 must be smaller than the electromagnetic-wave shielding film with pressure-sensitive adhesive layer 10A and the transparent substrate 2 so that its peripheries are thus back off from the peripheries of the electromagnetic-wave shielding film with pressure-sensitive adhesive layer 10A or the transparent substrate 2. On the other hand, the near-infrared ray blocking film 5 with the pressure-sensitive adhesive 4C may have the same size as the transparent substrate 2.

It is preferable that all peripheries of the antireflection film 3 are preferably back off from the peripheries of the electromagnetic-wave shielding film with pressure-sensitive adhesive layer 10A or the transparent substrate 2. However, when the first conductive sticky tape 8 is attached to only a part of the peripheries, for example, two peripheries opposite to each other, only the corresponding peripheries may be back off and the second conductive sticky tape 7 may be attached to only the corresponding peripheries.

To manufacture the electromagnetic-wave shielding and light transmitting plate 1B as shown in FIG. 6, for example, the antireflection film 3, the electromagnetic-wave shielding film with pressure-sensitive adhesive layer 10A, the transparent substrate 2, the near-infrared ray blocking film 5 with the pressure-sensitive adhesive 4C, the intermediate adhesive layer 4B, and the first and second conductive sticky tapes 8, 7 are first prepared. The electromagnetic-wave shielding film with pressure-sensitive adhesive layer 10A and the transparent substrate 2 are previously laminated via the intermediate adhesive layer 4B, and then heated with being compressed or heated with being decompressed under the hardening condition of the intermediate adhesive layer to unite them.

Then, the first conductive sticky tape 8 is bonded to the peripheries of the thus obtained laminated body. After that, the antireflection film 3 is pressed against the coating layer 15 made of the transparent pressure-sensitive adhesive of the electromagnetic-wave shielding film with pressure-sensitive adhesive layer 10A so that the antireflection film 3 is bonded to the electromagnetic-wave shielding film with pressure-sensitive adhesive layer 10A. Then, the near-infrared ray blocking film 5 is laminated to the laminated body with the pressure-sensitive adhesive 4C. After that, the second conductive sticky tape 7 is attached to the peripheries of the laminated body and is bonded and fixed according to a hardening method, such as thermo compression bonding or decompression heating, suitable for the pressure-sensitive adhesive layers 7B, 8B of the employed conductive sticky tapes 7, 8.

When cross-linkable conductive sticky tapes are used as the conductive sticky tapes 7, 8, the cross-linkable conductive sticky tapes are bonded by tackiness of the pressure-sensitive adhesive layers 7B, 8B thereof (this temporal adhesion allows re-adhesion, if necessary) and then heated or radiated with ultraviolet with some pressures or with keeping its decompressed state, if necessary. The ultraviolet radiation may be performed with heating. The cross-linkable conductive sticky tape may be partially bonded by partially heating or radiating ultraviolet.

The thermo compression bonding can be easily conducted by a normal heat sealer. As one of compression and heating methods, a pressurizing and heating method may be employed that the laminated body bonded with the cross-linkable conductive sticky tape is inserted into a pressurized chamber such as an autoclave and is heated, or a vacuuming and heating method may be employed that the laminated body as mentioned above is inserted into a vacuum bag which is then vacuumed and after that is heated. Therefore, the bonding operation is quite easy.

The bonding condition in case of thermal cross-linking depends on the type of crosslinking agent (organic peroxide) to be employed. The cross-linking is conducted normally at a temperature from 70 to 150° C., preferably from 70 to 130° C. and normally for 10 seconds to 120 minutes, preferably 20 seconds to 60 minutes.

In case of optical cross-linking, various light sources emitting in ultraviolet to visible range may be employed. Examples include an extra-high pressure, high pressure, or low pressure mercury lamp, a chemical lamp, a xenon lamp, a halogen lamp, a Mercury halogen lamp, a carbon arc lamp, an incandescent lamp, and a laser radiation. The period of radiation is not limited because it depends on the type of lamp and the strength of the light source, but normally in a range from dozens of seconds to dozens of minutes. In order to aid the cross-linking, ultraviolet may be radiated after previously heating to 40-120° C.

The pressure for bonding should be suitably selected and is preferably 5-50 kg/cm$^2$, particularly 10-30 kg/cm$^2$.

The structure (material, thickness etc.) of the transparent substrate 2, the structure (material, lamination arrangement, thickness etc.) of the antireflection film 3, the structure (material, lamination arrangement, thickness etc.) of the near-infrared ray blocking film 5, the kind and thickness of the thermosetting resin forming the intermediate adhesive layer 4B bonding the electromagnetic-wave shielding film with pressure-sensitive adhesive layer 10A and the transparent substrate 2, and the structure (material, thickness etc.) of the conductive sticky tapes 7, 8 are the same as those as described with reference to the electromagnetic-wave shielding and light transmitting plate according to the first aspect.

As mentioned above, the intermediate adhesive layer 4B is preferably made of cross-linkable EVA. In case of using such intermediate adhesive layer 4B, the electromagnetic-wave shielding film with pressure-sensitive adhesive layer 10A is laminated and temporally bonded to the transparent substrate 2 via the intermediate adhesive layer 4B with some pressure (this temporal adhesion allows re-adhesion, if necessary) and after that are pressurized and heated or depressurized and heated, thereby bonding the electromagnetic-wave shielding film with pressure-sensitive adhesive layer 10A and the transparent substrate 2 with no air bubbles being captured therebetween.

Also in the electromagnetic-wave shielding and light transmitting plate 1B of FIG. 6, the near-infrared ray blocking film 5 is preferably laminated on the transparent substrate 2 by using the pressure-sensitive adhesive 4C. This is because the near-infrared ray blocking film 5 is sensitive to heat so as not to withstand heat at temperature for crosslinking (130-150° C.). Low-temperature crosslinkable EVA (the temperature for crosslinking on the order of 70-130° C.) can be used for bonding the near-infrared ray blocking film 5 to the transparent substrate 2.

The intermediate adhesive layer 4B may further include, in small amounts, ultraviolet ray absorbing agent, infrared ray absorbing agent, antioxidant, and/or paint processing aid. For adjusting the color of the filter itself, it may further include coloring agent such as dye and pigment, and/or filler such as carbon black, hydrophobic silica, and calcium carbonate.

It is also effective that the intermediate adhesive layer in sheet condition is surfaced by corona discharge process, low temperature plasma process, electron beam irradiation process, or ultraviolet irradiation process as measures of improving the adhesive property.

The intermediate adhesive layer 4B can be manufactured by first mixing the adhesive resin and the additives listed above, kneading them by an extruder or a roll, and after that, forming in a predetermined configuration by means of a film forming method such as calendering, rolling, T-die extrusion, or inflation. During the film formation, embossing is provided for preventing the blocking between sheets and facilitating the deaerating during compressed onto the transparent base plate.

Besides the aforementioned adhesive agent, pressure-sensitive adhesive may also be suitably employed as the intermediate adhesive layer 4B. As this pressure-sensitive adhesive and the pressure-sensitive adhesive 4C of the near-infrared ray blocking film 5, acrylic adhesives, thermoplastic elastomers such as SBS and SEBS may also be suitably employed. Such pressure-sensitive adhesives may further suitably include tackifier, ultraviolet ray absorbing agent, coloring pigment, coloring dye, antioxidant, and/or sticking aid. The pressure-sensitive adhesive may be previously applied on the transparent substrate 2 or the near-infrared ray blocking film 5 to have a thickness of 5-100 μm by coating or lamination and, after that, the transparent substrate 2 or the near-infrared ray blocking film 5 with the pressure-sensitive adhesive may be attached to the transparent substrate or another film.

Since the electromagnetic-wave shielding and light transmitting plate 1B of FIG. 6 also has the conductive sticky tapes 7, 8 attached thereto, the electromagnetic-wave shielding and light transmitting plate 1B can be quite easily built in a body of equipment and can provide good electric continuity between the electromagnetic-wave shielding film 10A and the body of equipment through the first and second conductive sticky tapes 7, 8 just by fitting into the body, thereby exhibiting high electromagnetic-wave shielding function. In addition, excellent near infrared ray blocking capability can be obtained because of the existence of the near-infrared ray blocking film 5. Further, since only a single piece of the transparent substrate 2 is used, the plate is thin and light. Since both the surfaces of the transparent substrate 2 are covered by the films 3, 5, respectively, the electromagnetic-wave shielding and light transmitting plate has an effect of preventing the transparent substrate 2 from being broken and an effect of preventing the scattering of broken pieces of the transparent substrate 2 even if broken.

Since the electromagnetic-wave shielding film with pressure-sensitive adhesive layer 10A is formed by pattern-etching a conductive foil such as the copper foil 11, the design of the etching pattern can be suitably changed, whereby good electromagnetic-wave shielding function and good light transmitting property are both obtained and the moire phenomenon is prevented. The electromagnetic-wave shielding film with pressure-sensitive adhesive layer 10A has the light absorbing layer 12 and has small irregularities formed in the surface of the light absorbing layer 12 by surface roughening. Further, the irregularities are filled with the transparent pressure-sensitive adhesive, thereby providing high antireflection effect and obtaining a distinct image having high contrast.

Figure 8:
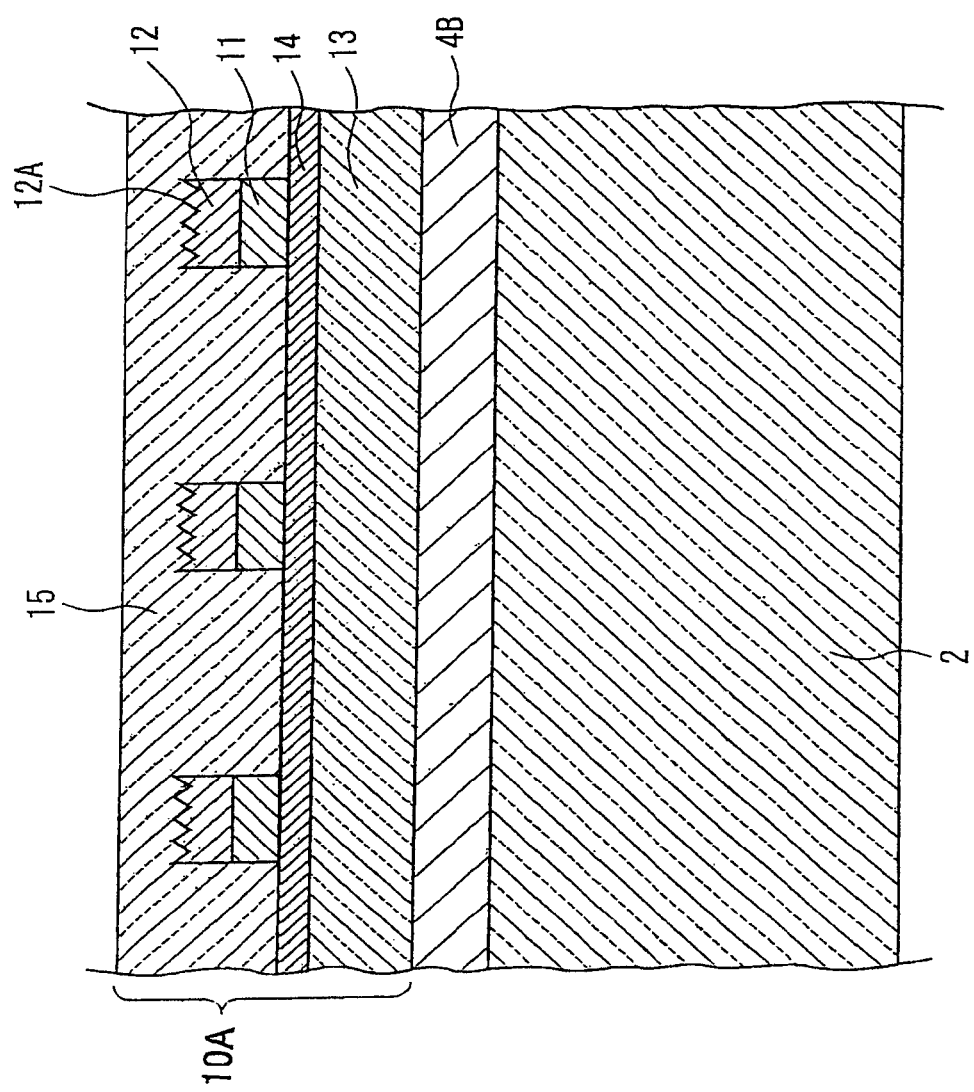
FIG. 8 is an enlarged sectional view for explaining a bonding portion between the electromagnetic-wave shielding film and a transparent substrate of the electromagnetic-wave shielding and light transmitting plate of FIG. 6.

That is, as shown in FIG. 8, the coating layer 15 of the transparent pressure-sensitive adhesive completely fills the irregularities by the copper foil 11 and the light absorbing layer 12 formed on the substrate film 13 and the transparent adhesive agent 14 of the electromagnetic-wave shielding film with pressure-sensitive adhesive layer 10A, thereby securely preventing light scattering due to the irregularities.

To further securely prevent the light scattering by means of the transparent pressure-sensitive adhesive, it is preferable that the refractive index of the transparent pressure-sensitive adhesive is set to be substantially equal to the refractive index of the transparent adhesive agent 14 so as to prevent reflection of light between the boundary faces of the coating layer 15 of the transparent pressure-sensitive adhesive and the transparent adhesive agent 14 as mentioned above.

The electromagnetic-wave shielding and light transmitting plate shown in FIG. 6 has been described by way of example of electromagnetic-wave shielding and light transmitting plates according to the second aspect of the present invention and the present invention is not limited by the shown examples.

For example, the copper/PET laminated etched film 10a as the electromagnetic-wave shielding film and the antireflection film 3 may be bonded to each other by a previously formed coating layer 15 of the transparent pressure-sensitive adhesive or by an intermediate adhesive layer as mentioned above. In this case, the refractive index of the adhesive resin after hardened of the intermediate adhesive layer to be used is preferably substantially equal to the refractive index of the substrate film 13 for preventing the reflection of light between these boundary faces.

Figure 10:
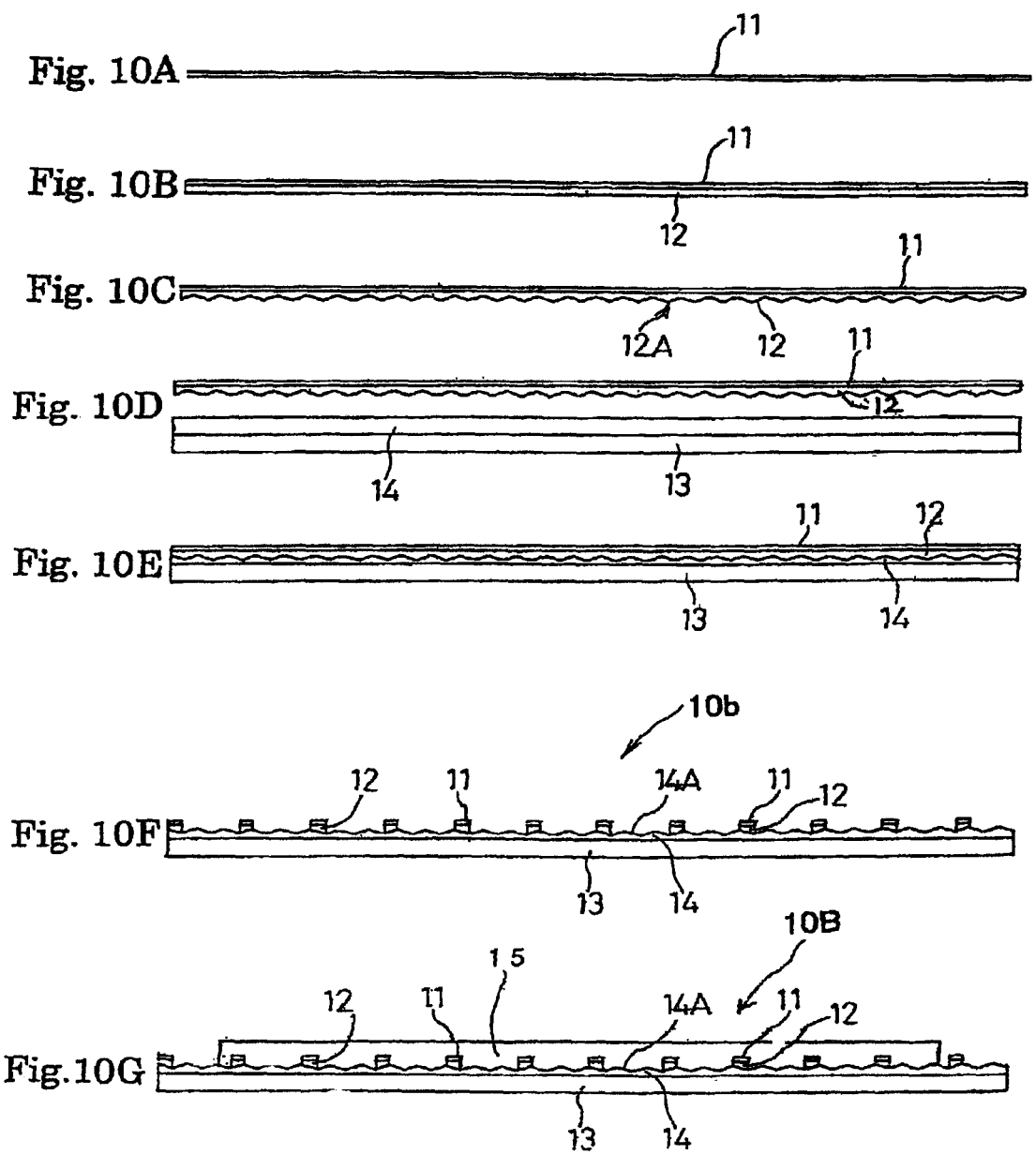
FIGS. 10A-10G are explanatory illustrations showing an exemplary method of manufacturing an electromagnetic-wave shielding film used in the third aspect.

With reference to FIGS. 10A-10Q an exemplary method of manufacturing an electromagnetic-wave shielding film to be used in an electromagnetic-wave shielding and light transmitting plate of the third aspect of the present invention will be described.

For example, a copper foil 11 is prepared as a conductive foil (FIG. 10A) and a light absorbing layer 12 is formed on one surface of the copper foil 11 (FIG. 10B). The light absorbing layer 12 is subjected to a matting process to form small irregularities by roughening the surface 12A thereof (FIG. 10C).

Then, the copper foil 11 on which the light absorbing layer 12 is formed and treated by the matting process to have a matte surface is bonded at its matte surface side to a transparent substrate film such as a PET (polyethylene terephthalate) film 13 with a transparent adhesive agent 14 (FIGS. 10D, 10E).

Pattern etching is conducted on the thus obtained laminated film according to the normal method, whereby the copper foil 11 with the light absorbing layer 12 formed thereon is partially removed so as to obtain a copper/PET laminated etched film 10b as the electromagnetic-wave shielding film (FIG. 10F).

Exposed surface 14A of the transparent adhesive agent 14 of the copper/PET laminated etched film 10b has irregularities corresponding to the small irregularities, formed by the matting process, of the light absorbing layer 12. A coating layer 15 is formed on the surface having the irregularities by applying a transparent pressure-sensitive adhesive, thereby obtaining an electromagnetic-wave shielding film with pressure-sensitive adhesive layer 10B (FIG. 10G).

The forming method of the light absorbing layer 12, the matting method, the thickness of the light absorbing layer 12, and the surface roughness of the surface 12A are the same as those described with regard to the aforementioned method of manufacturing the electromagnetic-wave shielding film to be used in the electromagnetic-wave shielding and light transmitting plate of the first aspect.

As the transparent pressure-sensitive adhesive forming the coating layer 15, various transparent pressure-sensitive adhesives may be employed. For example, acrylic adhesives, thermoplastic elastomers such as SBS and SEBS may also be suitably employed. Such pressure-sensitive adhesives may further suitably include tackifier, ultraviolet ray absorbing agent, coloring pigment, coloring dye, antioxidant, and/or sticking aid.

By forming the coating layer 15 of the transparent pressure-sensitive adhesive, the transparent pressure-sensitive adhesive can intrude the small irregularities in the surface 14A of the transparent adhesive agent 14 so that the small irregularities are completely filled with the transparent pressure-sensitive adhesive, thereby advantageously securely preventing light scattering due to the irregularities.

To further securely prevent the light scattering due to the small irregularities in the surface 14A of the transparent adhesive agent 14 by means of the transparent pressure-sensitive adhesive, it is preferable that the refractive index of the transparent adhesive agent 14 is set to be substantially equal to the refractive index of the transparent pressure-sensitive adhesive of the coating layer 15 so as to prevent reflection of light between boundary faces of the transparent adhesive agent 14 and the transparent pressure-sensitive adhesive of the coating layer 15.

Since the refractive index of the acrylic series, silicone series as the transparent pressure-sensitive adhesive forming the coating layer 15 is generally on the order of n=1.5, a transparent adhesive agent having a refractive index on the order of n=1.5 is preferably employed as the transparent adhesive agent 14. Examples of the transparent adhesive agent 14 having such a refractive index include transparent adhesive agents of acrylic series, urethane series, and rubber series.

The thickness of the coating layer 15 made of the transparent pressure-sensitive adhesive is preferably in a range from 1 to 100 μm more preferably in a range from 2 to 50 μm because neither a too thick layer nor a too thin layer can not conduct well adhesion when bonded to the transparent substrate as will be described later.

The coating layer 15 of the transparent pressure-sensitive adhesive is applied to expose the peripheries of the copper foil 11 to which a conductive sticky tape as will be described later is attached for manufacturing the electromagnetic-wave shielding and light transmitting plate.

The kind, the thickness, the pattern etching method, and the etched pattern of the conductive foil composing the electromagnetic-wave shielding film are the same as those described with regard to the aforementioned method of manufacturing the electromagnetic-wave shielding film to be used in the electromagnetic-wave shielding and light transmitting plate of the first aspect.

The kind and the thickness of the transparent substrate film to which the metal foil such as the copper foil 11 is attached and the transparent adhesive agent for bonding the transparent substrate film and the metal foil are also the same as mentioned above.

Hereinafter, with reference to FIG. 9, an embodiment of the method of manufacturing the electromagnetic-wave shielding and light transmitting plate using the electromagnetic-wave shielding film with pressure-sensitive adhesive layer 10B mentioned above will be described in detail.

Figure 9:
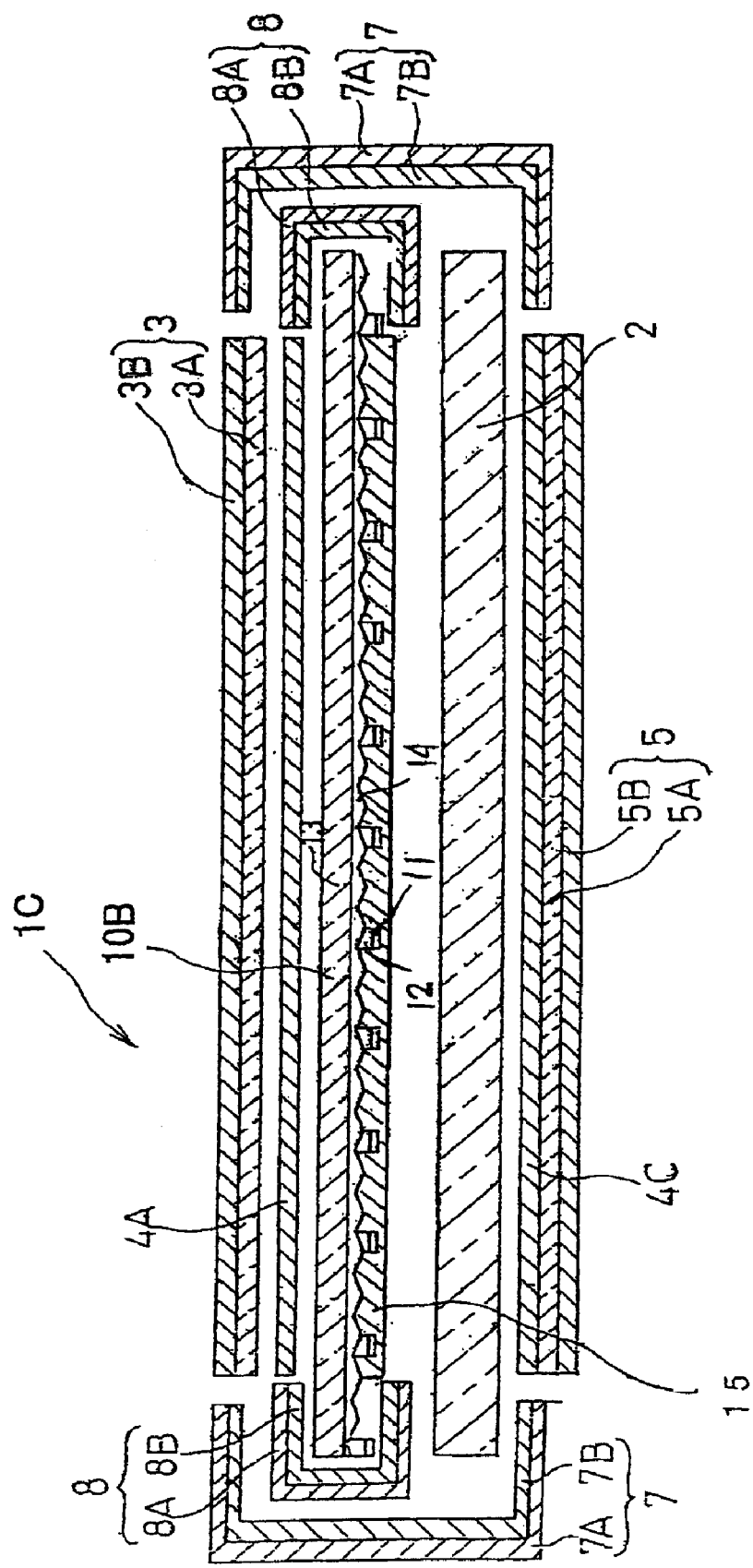
FIG. 9 is a schematic sectional view showing an embodiment of an electromagnetic-wave shielding and light transmitting plate according to the third aspect.

FIG. 9 is a schematic sectional view showing an embodiment of the electromagnetic-wave shielding and light transmitting plate manufactured according to the present invention.

The electromagnetic-wave shielding and light transmitting plate 1C of FIG. 9 comprises an antireflection film 3 as the front-most layer, an electromagnetic-wave shielding film with pressure-sensitive adhesive layer 10B, a transparent substrate 2, and a near-infrared ray blocking film 5 as the rear-most layer, wherein they are laminated together with an intermediate adhesive layer 4A, a transparent pressure-sensitive adhesive of the coating layer 15, and a pressure-sensitive adhesive 4C as adhesive agents to form a laminated body. A conductive sticky tape 7 (hereinafter, referred to as "second conductive sticky tape") is bonded to cover the peripheral ends of the laminated body and margins along the edges of the front surface and the rear surface thereof near the peripheral ends thereof. The size of the electromagnetic-wave shielding film with pressure-sensitive adhesive layer 10B is substantially equal to the size of the transparent substrate 2 and a conductive sticky tape 8 (hereinafter, referred to as "first conductive sticky tape") is bonded to and wound around the peripheral ends of the electromagnetic-wave shielding film to extend from one surface where the copper foil 11 is formed to the other surface at the peripheries thereof. The first conductive sticky tape 8 is preferably arranged all around the peripheries of the electromagnetic-wave shielding film with pressure-sensitive adhesive layer 10B. However, the first conductive sticky tape may be arranged partially, for example, may be arranged only on two peripheries opposite to each other.

In the electromagnetic-wave shielding and light transmitting plate 1C, the antireflection film 3 and the intermediate adhesive layer 4A under the antireflection film 3 are slightly smaller than the electromagnetic-wave shielding film with pressure-sensitive adhesive layer 10B or the transparent substrate 2 so that the peripheries of the antireflection film 3 and the intermediate adhesive layer 4A are slightly (preferably by 3-20 mm, particularly 5-10 mm) back off from the peripheries of the electromagnetic-wave shielding film with pressure-sensitive adhesive layer 10B or the transparent substrate 2 so that the first conductive sticky tape 8 arranged around the peripheries of the electromagnetic-wave shielding film with pressure-sensitive adhesive layer 10B is not covered by the antireflection film 3 or the intermediate adhesive layer 4A. Therefore, the second conductive sticky tape 7 is directly attached to the first conductive sticky tape 8, thereby securing the electric continuity of the electromagnetic-wave shielding film with pressure-sensitive adhesive layer 10B through the first and second conductive sticky tapes 8, 7.

The near-infrared ray blocking film 5 with the pressure-sensitive adhesive 4C is also slightly smaller than the transparent substrate 2 so that the peripheries of the near-infrared ray blocking film 5 with the pressure-sensitive adhesive 4C are slightly (preferably by 3-20 mm, particularly 5-10 mm) back off from the peripheries of the transparent substrate 2.

In this embodiment, none of the peripheries of the antireflection film 3, the intermediate adhesive layer 4A, and the near-infrared ray blocking film 5 with the pressure-sensitive adhesive 4C is covered by the second conductive sticky tape 7. However, these may be located inside of and covered by the second conductive sticky tape 7. In the electromagnetic-wave shielding and light transmitting plate 1C of FIG. 9, it is necessary to establish the electric continuity between the first conductive sticky tape 8 and the second conductive sticky tape 7. Therefore, the antireflection film 3 and the intermediate adhesive layer 4A must be smaller than the electromagnetic-wave shielding film with pressure-sensitive adhesive layer 10B and the transparent substrate 2 so that their peripheries are thus back off from the peripheries of the electromagnetic-wave shielding film with pressure-sensitive adhesive layer 10B or the transparent substrate 2. On the other hand, the near-infrared ray blocking film 5 with the pressure-sensitive adhesive 4C may have the same size as the transparent substrate 2.

It is preferable that all peripheries of the antireflection film 3 and the intermediate adhesive layer 4A are preferably back off from the peripheries of the electromagnetic-wave shielding film with pressure-sensitive adhesive layer 10B or the transparent substrate 2. However, when the first conductive sticky tape 8 is attached to only a part of the peripheries, for example, two peripheries opposite to each other, only the corresponding peripheries may be back off and the second conductive sticky tape 7 may be attached to only the corresponding peripheries.

To manufacture the electromagnetic-wave shielding and light transmitting plate 1C as shown in FIG. 9, for example, the antireflection film 3, the electromagnetic-wave shielding film with pressure-sensitive adhesive layer 10B, the transparent substrate 2, the near-infrared ray blocking film 5 with the pressure-sensitive adhesive 4C, the intermediate adhesive layer 4A, and the first and second conductive sticky tapes 8, 7 are first prepared. The first conductive sticky tape 8 is previously bonded to the peripheries of the electromagnetic-wave shielding film with pressure-sensitive adhesive layer 10B. The electromagnetic-wave shielding film with pressure-sensitive adhesive layer 10B with the first conductive sticky tape 8 is bonded to the transparent substrate 2.

Figure 11:
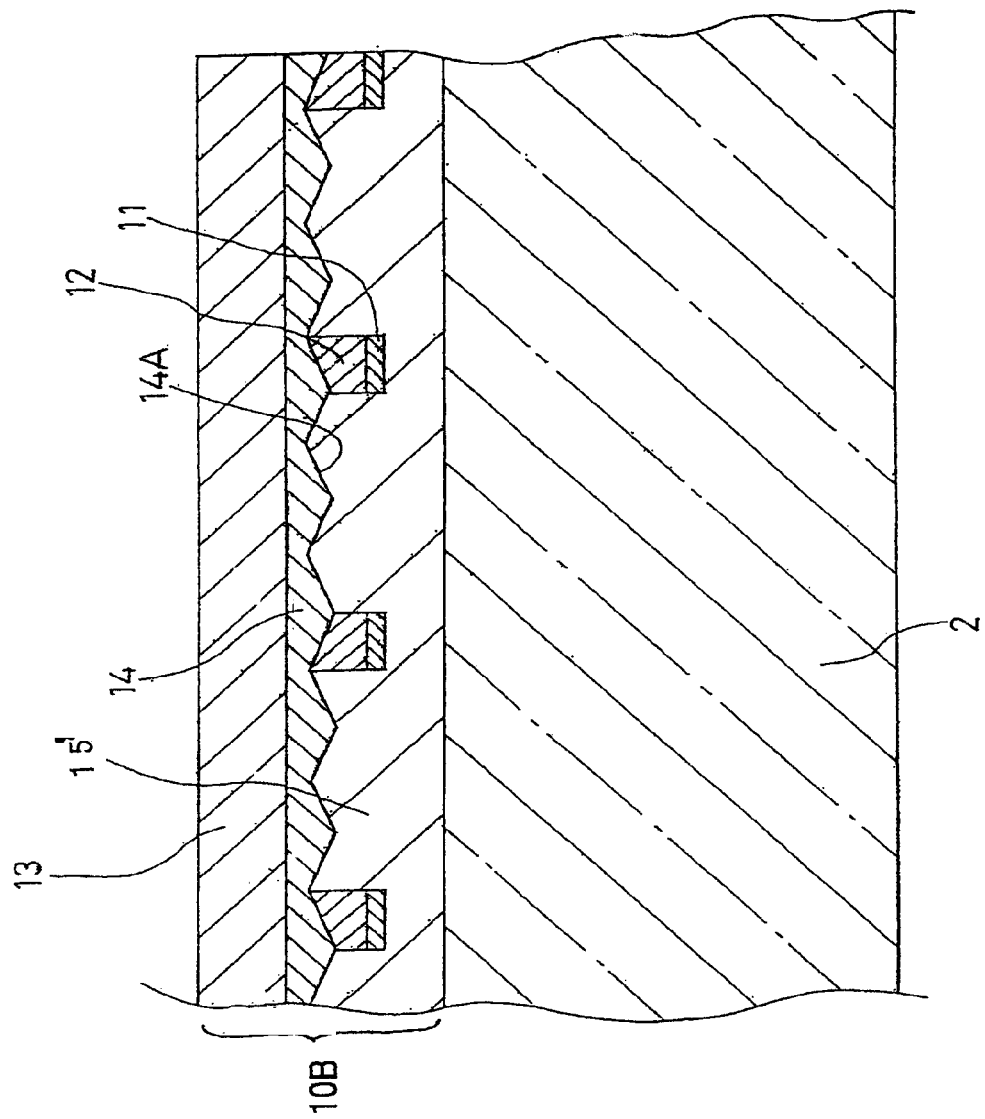
FIG. 11 is an enlarged sectional view for explaining a bonding portion between the electromagnetic-wave shielding film with adhesive layer and a transparent substrate of the electromagnetic-wave shielding and light transmitting plate of FIG. 9.

As for this bonding, the coating layer 15 of the transparent pressure-sensitive adhesive of the electromagnetic-wave shielding film with pressure-sensitive adhesive layer 10B is attached and laminated to the transparent substrate 2 and temporally bonded with some pressure (this temporal adhesion allows re-adhesion, if necessary) and after that are pressurized and heated or depressurized and heated, thereby bonding the electromagnetic-wave shielding film with pressure-sensitive adhesive layer 10B and the transparent substrate 2 with no air bubbles being captured therebetween as shown in FIG. 11. Therefore, the transparent pressure-sensitive adhesive 15' can intrude the small irregularities in the surface 14A of the transparent adhesive agent 14 of the electromagnetic-wave shielding film with pressure-sensitive adhesive layer 10B so that the small irregularities are completely filled with the transparent pressure-sensitive adhesive 15', thereby advantageously securely preventing light scattering due to the irregularities. By setting the refractive index of the transparent adhesive agent 14 to be the same as the refractive index of the transparent pressure-sensitive adhesive 15', the light scattering can be further securely prevented.

After that, the antireflection film 3 is laid via the intermediate adhesive layer 4A on the transparent substrate 2 with the electromagnetic-wave shielding film with pressure-sensitive adhesive layer 10B attached thereto and then heated with being compressed or heated with being decompressed under the hardening condition of the intermediate adhesive layer 4A to unite them. After that, the near-infrared ray blocking film 5 is laminated to the laminated body with the pressure-sensitive adhesive 4C. Then, the second conductive sticky tape 7 is attached to the peripheries of the laminated body and is bonded and fixed by pressurizing and heating or depressurizing and heating according to a hardening method suitable for the pressure-sensitive adhesive layers 7B, 8B of the employed conductive sticky tapes 7, 8.

When cross-linkable conductive sticky tapes are used as the conductive sticky tapes 7, 8, the cross-linkable conductive sticky tapes are bonded to the electromagnetic-wave shielding film and the laminated body by tackiness of the pressure-sensitive adhesive layers 7B, 8B thereof (this temporal adhesion allows re-adhesion, if necessary) and then heated or radiated with ultraviolet while being compressed or being decompressed, if necessary. The ultraviolet radiation may be performed with heating. The cross-linkable conductive sticky tape may be partially bonded by partially heating or radiating ultraviolet.

The thermo compression bonding can be easily conducted by a normal heat sealer. As one of compression and heating methods, a pressurizing and heating method may be employed that the laminated body bonded with the cross-linkable conductive sticky tape is inserted into a pressurized chamber such as an autoclave and is heated, or a vacuuming and heating method may be employed that the laminated body as mentioned above is inserted into a vacuum bag which is then vacuumed and after that is heated. Therefore, the bonding operation is quite easy.

The bonding condition in case of thermal cross-linking depends on the type of crosslinking agent (organic peroxide) to be employed. The cross-linking is conducted normally at a temperature from 70 to 150° C., preferably from 70 to 130° C. and normally for 10 seconds to 120 minutes, preferably 20 seconds to 60 minutes.

In case of optical cross-linking, various light sources emitting in ultraviolet to visible range may be employed. Examples include an extra-high pressure, high pressure, or low pressure mercury lamp, a chemical lamp, a xenon lamp, a halogen lamp, a Mercury halogen lamp, a carbon arc lamp, an incandescent lamp, and a laser radiation. The period of radiation is not limited because it depends on the type of lamp and the strength of the light source, but normally in a range from dozens of seconds to dozens of minutes. In order to aid the cross-linking, ultraviolet may be radiated after previously heating to 40-120° C.

The pressure for bonding should be suitably selected and is preferably 5-50 kg/cm$^2$, particularly 10-30 kg/cm$^2$.

The structure (material, thickness etc.) of the transparent substrate 2, the structure (material, lamination arrangement, thickness etc.) of the antireflection film 3, the structure (material, lamination arrangement, thickness etc.) of the near-infrared ray blocking film 5, the kind and thickness of the thermosetting resin forming the intermediate adhesive layer 4A bonding the electromagnetic-wave shielding film with pressure-sensitive adhesive layer 10B and the antireflection film 3, and the structure (material, thickness etc.) of the conductive sticky tapes 7, 8 are the same as those as described with reference to the electromagnetic-wave shielding and light transmitting plate according to the first aspect.

Besides the aforementioned adhesive agents, the agents listed above as the transparent pressure-sensitive adhesive to be used in the electromagnetic-wave shielding film with pressure-sensitive adhesive layer 10B may also be suitably used as the intermediate adhesive layer 4A.

The agents listed above as the transparent pressure-sensitive adhesive to be used in the electromagnetic-wave shielding film with pressure-sensitive adhesive layer 10B may also be suitably used as the pressure-sensitive adhesive 4C of the near-infrared ray blocking film 5. The pressure-sensitive adhesive 4C may be previously applied on the near-infrared ray blocking film 5 to have a thickness of 5-100 μm by coating or lamination and, after that, the near-infrared ray blocking film 5 with the pressure-sensitive adhesive may be attached to the transparent substrate or another film.

The near-infrared ray blocking film 5 is preferably laminated on the transparent substrate 2 by using the pressure-sensitive adhesive 4C. This is because the near-infrared ray blocking film 5 is sensitive to heat so as not to withstand heat at temperature for crosslinking (130-150° C.). Low-temperature crosslinkable EVA (the temperature for crosslinking on the order of 70-130° C.) can be used for bonding the near-infrared ray blocking film 5 to the transparent substrate 2.

As shown in FIG. 9, the electromagnetic-wave shielding and light transmitting plate 1C with the conductive sticky tapes 7, 8 can be quite easily built in a body of equipment and can provide good electric continuity between the electromagnetic-wave shielding film 10B and the body of equipment through the first and second conductive sticky tapes 7, 8 only by fitting into the body, thereby exhibiting high electromagnetic-wave shielding function. In addition, excellent near infrared ray blocking capability can be obtained because of the existence of the near-infrared ray blocking film 5. Further, since only a single piece of the transparent substrate 2 is used, the plate is thin and light. Since both the surfaces of the transparent substrate 2 are covered by the films 3, 5, respectively, the electromagnetic-wave shielding and light transmitting plate has an effect of preventing the transparent substrate 2 from being broken and an effect of preventing the scattering of broken pieces of the transparent substrate 2 even if broken.

Since the electromagnetic-wave shielding film 10B is formed by pattern-etching a conductive foil such as the copper foil 11, the design of the etching pattern can be suitably changed, whereby good electromagnetic-wave shielding function and good light transmitting function are both obtained and the moire phenomenon is prevented. The electromagnetic-wave shielding film 10B has the light absorbing layer 12 and has small irregularities formed in the surface of the light absorbing layer 12 by surface roughening. Further, irregularities in the transparent adhesive agent 14 formed by transfer of the small irregularities are filled with the transparent pressure-sensitive adhesive 15', thereby providing high antireflection effect and obtaining a distinct image having high contrast.

The electromagnetic-wave shielding and light transmitting plate shown in FIG. 9 has been described by way of example of electromagnetic-wave shielding and light transmitting plates to be manufactured in the method of the present invention and the present invention is not limited by the shown examples.

The electromagnetic-wave shielding and light transmitting plates of the present invention and the electromagnetic-wave shielding and light transmitting plates to be manufactured in the method of the present invention as described in detail above are quite suitable for a front filter of PDP and a window of a place where a precision apparatus is installed, such as a hospital or a laboratory.

Hereinafter, embodiments of s display panel of the present invention will be described in detail with reference to FIGS. 12 and 13.

Figure 12:
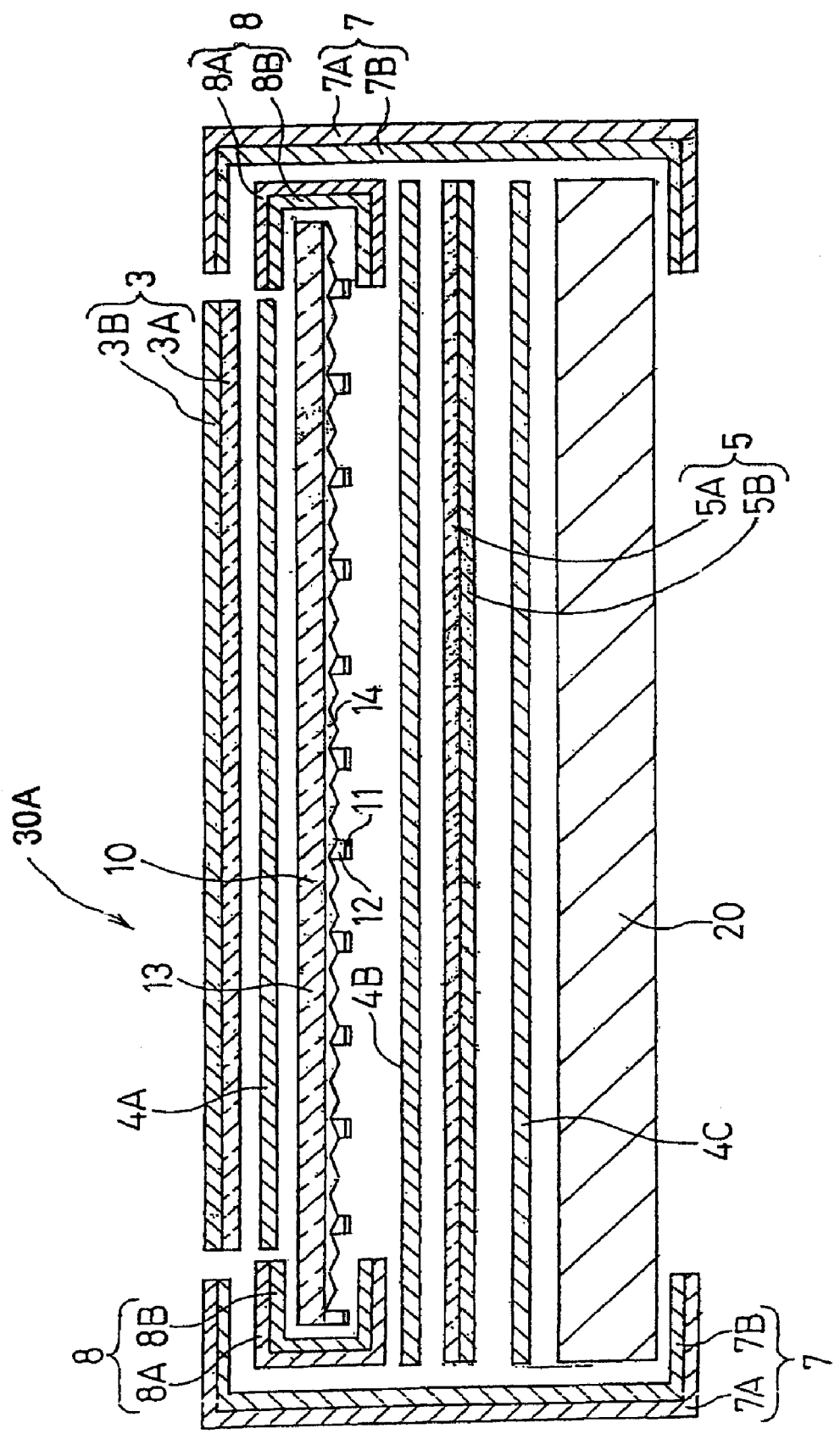
FIG. 12 is a schematic sectional view showing an embodiment of a display panel according to the fourth aspect.
Figure 13:
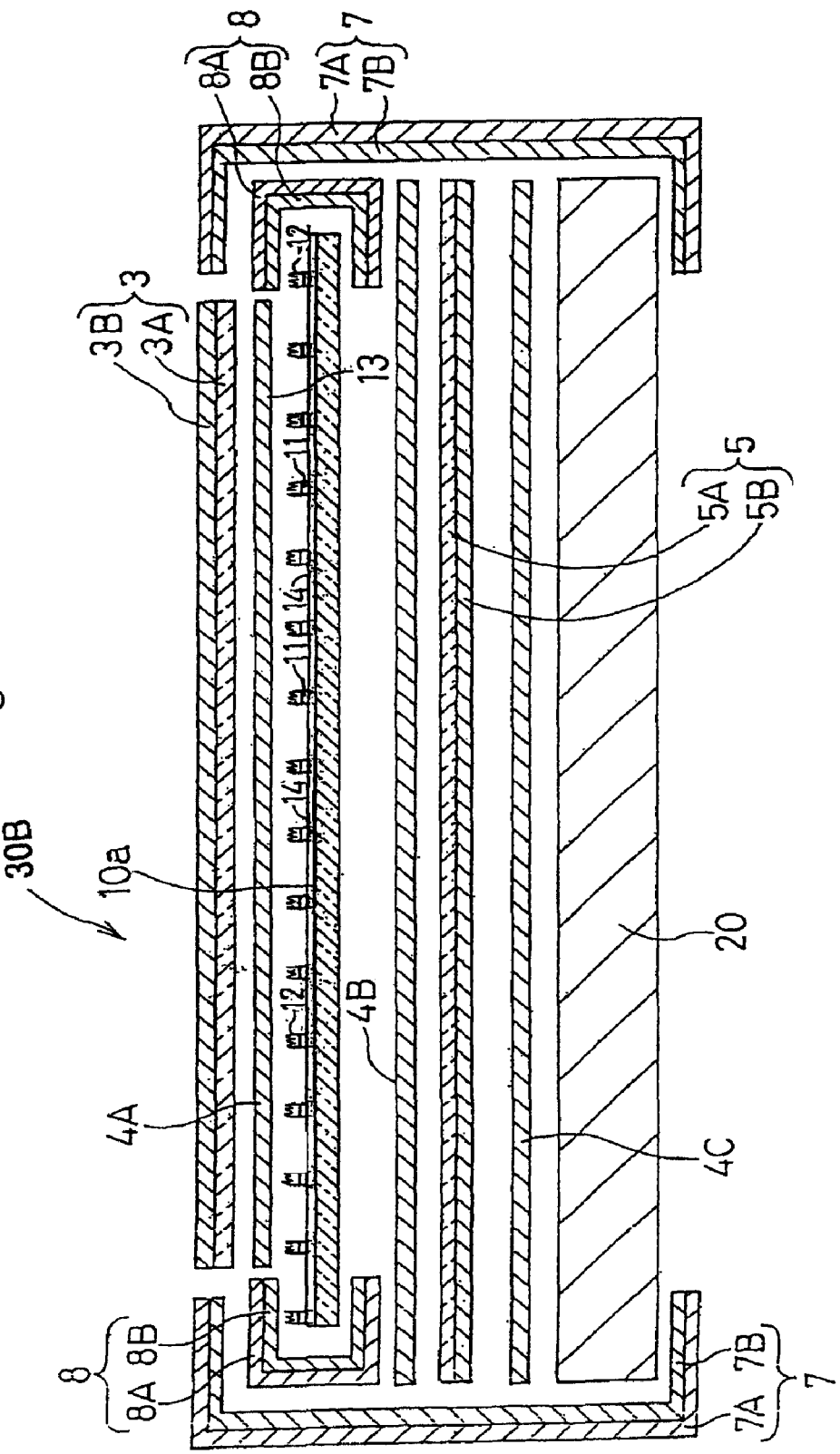
FIG. 13 is a schematic sectional view showing an embodiment of a display panel according to the fifth aspect.

FIG. 12 is a schematic sectional view showing an embodiment of a display panel according to the fourth aspect of the present invention and FIG. 13 is a schematic sectional view showing an embodiment of a display panel according to the fifth aspect of the present invention.

A display panel 30A of FIG. 12 comprises an antireflection film 3 as the front-most layer, a copper/PET laminated etched film 10 as the electromagnetic-wave shielding film (the electromagnetic-wave shielding film 10 has the same structure as the electromagnetic-wave shielding film used in the electromagnetic-wave shielding and light transmitting plate according to the first aspect and is manufactured by the procedures shown in FIG. 3A through FIG. 3F), a near-infrared ray blocking film 5, and a PDP body 20, wherein they are laminated and united by using intermediate adhesive layers 4A, 4B, 4C as the adhesive agents so as to form a laminated body. A conductive sticky tape 7 (second conductive sticky tape) is bonded to cover the peripheral ends of the laminated body and margins along the edges of the front surface and the rear surface thereof near the peripheral ends thereof.

A display panel 30B of FIG. 13 comprises an antireflection film 3 as the front-most layer, a copper/PET laminated etched film 10a as the electromagnetic-wave shielding film (the electromagnetic-wave shielding film 10a has the same structure as the copper/PET laminated etched film 10a before the formation of the coating layer 15 of transparent pressure-sensitive adhesive of the electromagnetic-wave shielding film used in the electromagnetic-wave shielding and light transmitting plate according to the second aspect and is manufactured by the procedures shown in FIG. 7A through FIG. 7E), a near-infrared ray blocking film 5, and a PDP body 20, wherein they are laminated and united by using intermediate adhesive layers 4A, 4B, 4C as the adhesive agents so as to form a laminated body. A conductive sticky tape 7 is bonded to cover the peripheral ends of the laminated body and margins along the edges of the front surface and the rear surface thereof near the peripheral ends thereof.

The size of the electromagnetic-wave shielding film 10 (10a) is substantially equal to the size of the PDP body 20 and a conductive sticky tape 8 (hereinafter, referred to as "first conductive sticky tape") is bonded to and wound around the peripheral ends of the electromagnetic-wave shielding film to extend from one surface to the other surface thereof. The first conductive sticky tape 8 is preferably arranged all around the peripheries of the electromagnetic-wave shielding film 10 (10a). However, the first conductive sticky tape may be arranged partially, for example, may be arranged only on two peripheries opposite to each other.

In the display panel 30A (30B), the antireflection film 3 and the intermediate adhesive layer 4A under the antireflection film 3 are slightly smaller than the electromagnetic-wave shielding film 10 (10a) so that the peripheries of the antireflection film 3 and the intermediate adhesive layer 4A are slightly (preferably by 3-20 mm, particularly 5-10 mm) back off from the peripheries of the electromagnetic-wave shielding film 10 (10a) so that the first conductive sticky tape 8 arranged around the peripheries of the electromagnetic-wave shielding film 10 (10a) is not covered by the antireflection film 3 and the intermediate adhesive layer 4A. Therefore, the second conductive sticky tape 7 is directly attached to the first conductive sticky tape 8, thereby securing the electric continuity of the electromagnetic-wave shielding film 10 (10a) through the first and second conductive sticky tapes 8, 7.

In this embodiment, none of the peripheries of the antireflection film 3 and the intermediate adhesive layer 4A covers the second conductive sticky tape 7. However, these may be arranged outside the second conductive sticky tape 7 to cover the second conductive sticky tape 7. In the display panel 30A (30B) of FIG. 12 (FIG. 13), it is necessary to establish the electric continuity between the first conductive sticky tape 8 and the second conductive sticky tape 7. Therefore, the antireflection film 3 and the intermediate adhesive layer 4A must be smaller than the electromagnetic-wave shielding film 10 (10a) so that their peripheries are thus back off from the peripheries of the electromagnetic-wave shielding film 10 (10a).

It is preferable that all peripheries of the antireflection film 3 and the intermediate adhesive layer 4A are preferably back off from the peripheries of the electromagnetic-wave shielding film 10 (10a). However, when the first conductive sticky tape 8 is attached to only a part of the peripheries, for example, two peripheries opposite to each other, only the corresponding peripheries may be back off and the second conductive sticky tape 7 may be attached to only the corresponding peripheries.

The structure (material, lamination arrangement, thickness etc.) of the antireflection film 3, the structure (material, lamination arrangement, thickness etc.) of the near-infrared ray blocking film 5, the kind and thickness of the thermosetting resin forming the intermediate adhesive layers 4A, 4B, 4C bonding the antireflection film 3, the electromagnetic-wave shielding film 10 (10a), the near-infrared ray blocking film 5 and the PDP body 20, and the structure (material, thickness etc.) of the conductive sticky tapes 7, 8 are the same as those as described with reference to the electromagnetic-wave shielding and light transmitting plate according to the first aspect.

Figure 16:
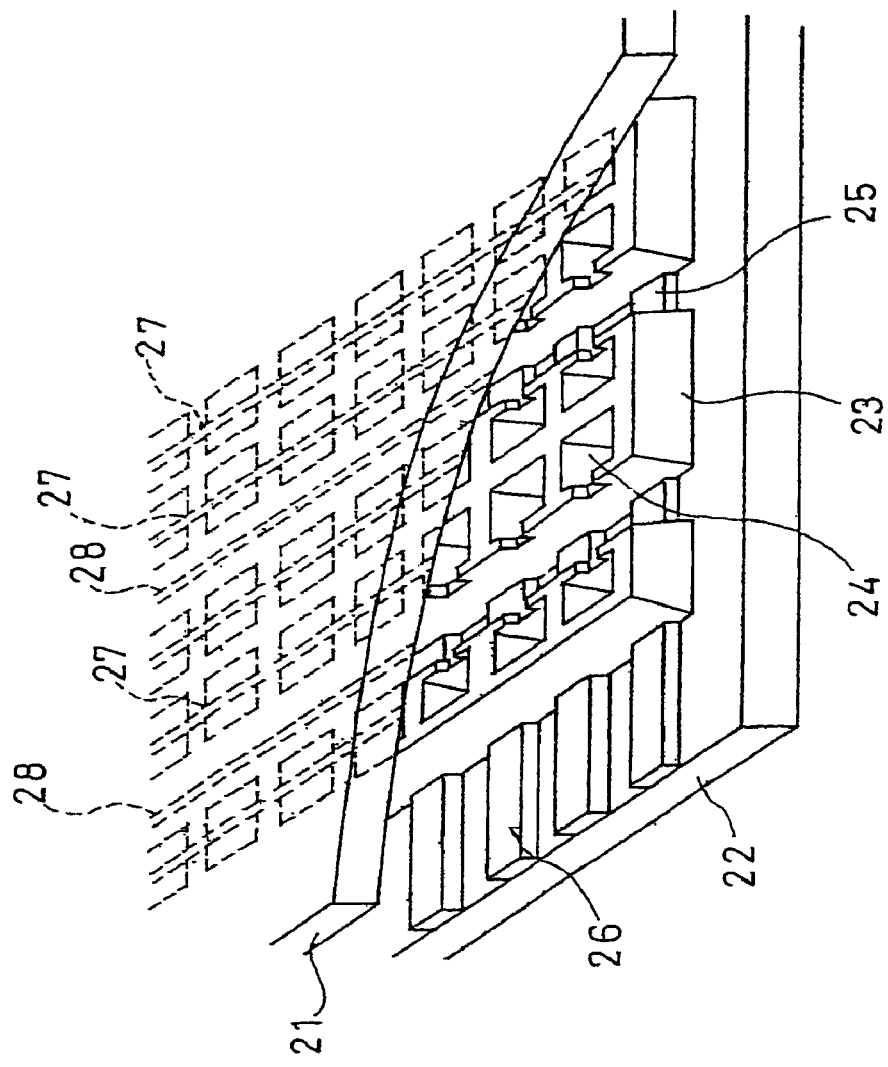
FIG. 16 is a partially cut-away perspective view showing the structure of a typical PDP.

As the PDP body 20, a PDP as shown in FIG. 16 may be employed.

Figure 14:
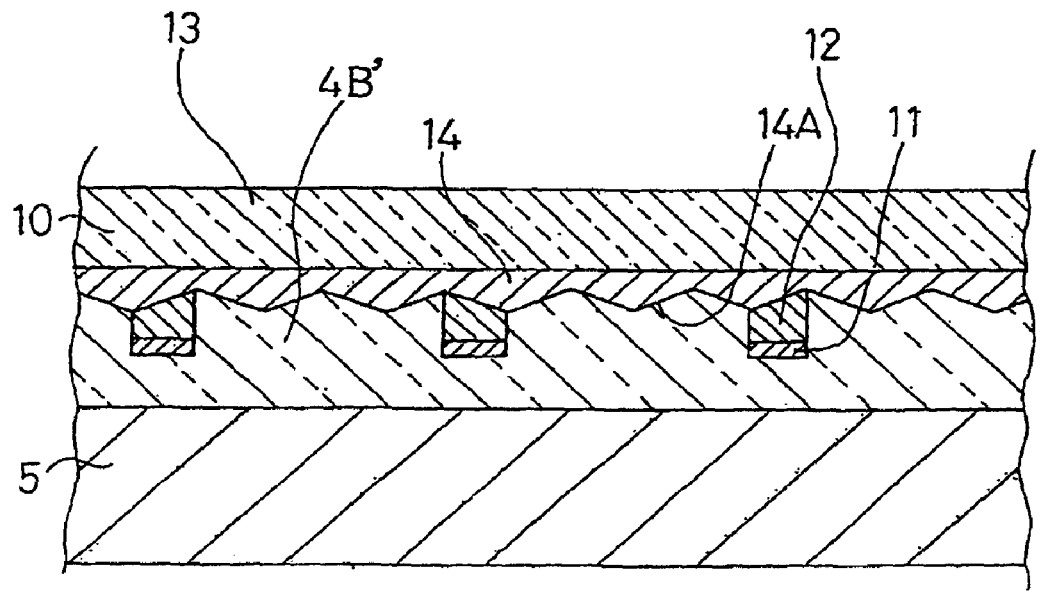
FIG. 14 is an enlarged sectional view for explaining a bonding portion between the electromagnetic-wave shielding film and another member of the display panel of FIG. 12.

Similarly to the electromagnetic-wave shielding and light transmitting plate of the present invention, when such crosslinked EVA is used as the thermosetting resin forming the intermediate adhesive layers 4A-4C, the components of the display panel 30A (30B) are laminated and temporally bonded via the intermediate adhesive layers 4A-4C with some pressure (this temporal adhesion allows re-adhesion, if necessary) and, after that, are pressurized and heated, thereby bonding the members with no air bubbles being captured therebetween. Therefore, in the display panel 30A of FIG. 12, the electromagnetic-wave shielding film 10 and the near-infrared ray blocking film 5 are laminated and temporally bonded via the intermediate adhesive layer 4B and, after that, are pressurized and heated, thereby bonding the electromagnetic-wave shielding film 10 and the near-infrared ray blocking film 5 with no air bubbles being captured therebetween as shown in FIG. 14. Accordingly, the adhesive resin 4B' of the intermediate adhesive layer 4B can intrude the small irregularities in the surface 14A of the transparent adhesive agent 14 of the electromagnetic-wave shielding film 10 so that the small irregularities are completely filled with the adhesive resin 4B', thereby advantageously securely preventing light scattering due to the irregularities.

To further securely prevent the light scattering due to the small irregularities in the surface 14A of the transparent adhesive agent 14 of the electromagnetic-wave shielding film 10 by means of the adhesive resin 4B' of the intermediate adhesive layer 4B, it is preferable that the refractive index of the transparent adhesive agent 14 is set to be substantially equal to the refractive index of the adhesive resin 4B' after hardened so as to prevent reflection of light between the boundary faces of the transparent adhesive agent 14 and the adhesive resin 4B'.

Since the refractive index of the EVA as the adhesive resin 4B' is on the order of n=1.5, a transparent adhesive agent having a refractive index on the order of n=1.5 is preferably employed as the transparent adhesive agent 14. Examples of the transparent adhesive agent 14 having such a refractive index include transparent adhesive agents of acrylic series, urethane series, epoxy series, and rubber series.

Figure 15:
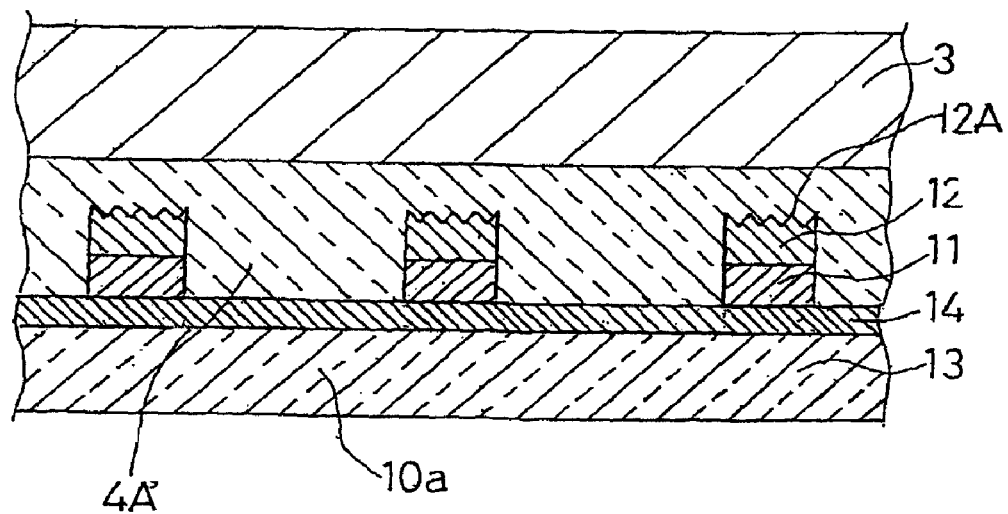
FIG. 15 is an enlarged sectional view for explaining a bonding portion between the electromagnetic-wave shielding film and another member of the display panel of FIG. 13.

Similarly, in the display panel 30B of FIG. 13, the electromagnetic-wave shielding film 10a and the antireflection film 3 are laminated and temporally bonded via the intermediate adhesive layer 4A and, after that, are pressurized and heated, thereby bonding the electromagnetic-wave shielding film 10a and the antireflection film 3 with no air bubbles being captured therebetween as shown in FIG. 15. The adhesive resin 4A' of the intermediate adhesive layer 4A completely fills the irregularities by the copper foil 11 and the light absorbing layer 12 formed on the substrate film 13 and the transparent adhesive agent 14 of the electromagnetic-wave shielding film 10a, thereby securely preventing light scattering due to the irregularities.

It is preferable that the refractive index of the transparent adhesive agent 14 is set to be substantially equal to the refractive index of the adhesive resin 4A' after hardened so as to reduce the reflection of light between the boundary faces between the adhesive resin 4A' of the intermediate adhesive layer 4A and transparent adhesive agent 14 of the electromagnetic-wave shielding film 10a.

Since the refractive index of the EVA as the adhesive resin 4A' is on the order of n=1.5, a transparent adhesive agent having a refractive index on the order of n=1.5 is preferably employed as the transparent adhesive agent 14. Examples of the transparent adhesive agent 14 having such a refractive index include transparent adhesive agents of acrylic series, urethane series, and rubber series.

Besides the aforementioned adhesive agent, a transparent pressure-sensitive adhesive may also be suitably employed as the intermediate adhesive layers 4A, 4B, 4C. As this transparent pressure-sensitive adhesive, acrylic adhesives, and thermoplastic elastomers such as SBS and SEBS may also be suitably employed. Such transparent pressure-sensitive adhesives may further suitably include tackifier, ultraviolet ray absorbing agent, coloring pigment, coloring dye, antioxidant, and/or sticking aid. The transparent pressure-sensitive adhesive may be previously applied on the antireflection film 3, the electromagnetic-wave shielding films 10, 10a, or the near-infrared ray blocking film 5 to have a thickness of 5-100 μm by coating or lamination and, after that, the films may be attached to the PDP body 20 or another film.

It is preferable that the near-infrared ray blocking film 5 is laminated and bonded by using a pressure-sensitive adhesive. This is because the near-infrared ray blocking film 5 is sensitive to heat so as not to withstand heat at temperature for crosslinking (130-150° C.). Low-temperature crosslinkable EVA (the temperature for crosslinking on the order of 70-130° C.) can be used for bonding the near-infrared ray blocking film 5.

To manufacture the display panel 30A (30B) as shown in FIG. 12 (FIG. 13), for example, the antireflection film 3, the electromagnetic-wave shielding film 10 (10a), the near-infrared ray blocking film 5, the PDP body 20, the intermediate adhesive layers 4A, 4B, 4C, and the first and second conductive sticky tapes 8, 7 are first prepared. The first conductive sticky tape 8 is previously bonded to the peripheries of the electromagnetic-wave shielding film 10 (10a). Then, the antireflection film 3, the electromagnetic-wave shielding film 10 (10a) with the first conductive sticky tape 8, and the near-infrared ray blocking film 5, and the PDP body 20 are laminated with the intermediate adhesive layers 4A, 4B, 4C interposed therebetween, respectively and then heated with being compressed under the hardening condition of the intermediate adhesive layers to unite them. After that, the second conductive sticky tape 7 is attached to the peripheries of the laminated body and is bonded and fixed according to a hardening method, such as thermo compression bonding, suitable for the pressure-sensitive adhesive layers 7B, 8B of the employed conductive sticky tapes 7, 8.

When cross-linkable conductive sticky tapes are used as the conductive sticky tapes 7, 8, the cross-linkable conductive sticky tapes are bonded to the electromagnetic-wave shielding film and the laminated body by tackiness of the pressure-sensitive adhesive layers 7B, 8B thereof (this temporal adhesion allows re-adhesion, if necessary) and then heated or radiated with ultraviolet with some pressures, if necessary. The ultraviolet radiation may be performed with heating. The cross-linkable conductive sticky tape may be partially bonded by partially heating or radiating ultraviolet.

The thermo compression bonding can be easily conducted by a normal heat sealer. As one of compression and heating methods, a pressurizing and heating method may be employed that the laminated body bonded with the cross-linkable conductive sticky tape is inserted into a vacuum bag which is then vacuumed and after that is heated. Therefore, the bonding operation is quite easy.

The bonding condition in case of thermal cross-linking depends on the type of crosslinking agent (organic peroxide) to be employed. The cross-linking is conducted normally at a temperature from 70 to 150° C., preferably from 70 to 130° C. and normally for 10 seconds to 120 minutes, preferably 20 seconds to 60 minutes.

In case of optical cross-linking, various light sources emitting in ultraviolet to visible range may be employed. Examples include an extra-high pressure, high pressure, or low pressure mercury lamp, a chemical lamp, a xenon lamp, a halogen lamp, a Mercury halogen lamp, a carbon arc lamp, an incandescent lamp, and a laser radiation. The period of radiation is not limited because it depends on the type of lamp and the strength of the light source, but normally in a range from dozens of seconds to dozens of minutes. In order to aid the cross-linking, ultraviolet may be radiated after previously heating to 40-120° C.

The pressure for bonding should be suitably selected and is preferably 5-50 kg/cm², particularly 10-30 kg/cm².

The display panel 30A (30B) with the conductive sticky tapes 7, 8 attached thereto can be quite easily built in a body of equipment and can provide good electric continuity between the electromagnetic-wave shielding film 10 (10a) and the body of equipment through the first and second conductive sticky tapes 7, 8 only by fitting the display panel into the body, thereby exhibiting high electromagnetic-wave shielding function. Since there is the antireflection film 3 at the front surface side of the electromagnetic-wave shielding film 10 (10a), excellent antireflection effect can be obtained because of the antireflection film 3. In addition, excellent near infrared ray blocking capability can be obtained because of the existence of the near-infrared ray blocking film 5, thereby preventing occurrence of malfunction of remote control. Further, since the display panel is made by laminating and bonding the film onto the PDP body 20, the display panel is thin and light. Since the front surface of the PDP body 20 is covered by the antireflection film 3 as the front-most layer, the electromagnetic-wave shielding film 10 (10a), and the near-infrared ray blocking film 5, the PDP body is protected to have improved impact resistance and an effect of preventing the PDP body from being broken and an effect of preventing the scattering of broken pieces of the PDP body 20 even if broken.

Since the electromagnetic-wave shielding film 10 (10a) is formed by pattern-etching a conductive foil such as the copper foil 11, the design of the etching pattern can be suitably changed, whereby good electromagnetic-wave shielding function and good light transmitting property are both obtained and the moire phenomenon is prevented. The electromagnetic-wave shielding film 10 (10a) has the light absorbing layer 12 and has small irregularities formed in the surface of the light absorbing layer 12 by surface roughening.

Further, in the display panel 30A using the electromagnetic-wave shielding film 10, irregularities in the transparent adhesive agent 14 formed by transfer of the small irregularities of the film 10 are filled with the adhesive resin, thereby providing high antireflection effect and obtaining a distinct image having high contrast. Further, in the display panel 30B using the electromagnetic-wave shielding film 10a, the irregularities of the light absorbing layer 12 and the copper foil 11 are filled with the adhesive resin, thereby providing high antireflection effect and obtaining a distinct image having high contrast.

The display panels shown in FIGS. 12 and 13 have been described by way of examples of display panels of the present invention and the present invention is not limited by the shown examples.

INDUSTRIAL APPLICABILITY

As described in detail, according to the present invention, an electromagnetic-wave shielding and light transmitting plate is provided which not only has excellent electromagnetic-wave shielding function but also provides high antireflection effect and has a high level of transparency and a high level of visibility, thus is capable of obtaining a distinct image, and can be suitably used as a front filter for a PDP.

According to the display panel of the present invention, functions such as the electromagnetic-wave shielding function can be applied to a display panel itself by uniting a display panel body such as a PDP and an electromagnetic-wave shielding film. In addition, the improvement in productivity and reduction in cost can be achieved by reducing the weight, the thickness, and the number of parts of the display panel. Further, the occurrence of malfunction of the remote control can be prevented. Moreover, since the electromagnetic-wave shielding film not only has excellent electromagnetic-wave shielding function but also provides high antireflection effect and has a high level of transparency and a high level of visibility, the display panel can provide a distinct image.

We claim:

1. An electromagnetic-wave shielding and light transmitting plate having at least an electromagnetic-wave shielding film and a transparent substrate which are laminated and united, wherein said electromagnetic-wave shielding film comprising a transparent substrate film and a conductive foil which is bonded to the transparent substrate side surface of said transparent substrate film with a transparent adhesive agent, and is applied with pattern etching, said conductive foil has a light absorbing layer for antireflection provided on a transparent substrate film side surface of said conductive foil, and a transparent substrate film side surface of said light absorbing layer is treated by surface roughening, wherein the surface roughness Rz of the roughened surface of the light absorbing layer is in a range from 0.1 to 20 μm, wherein the roughened surface is one of a shot blasted surface, a chemically roughened surface using acid or alkali and an ink covered surface, the ink previously mixed with inorganic or organic fine particles.

2. An electromagnetic-wave shielding and light transmitting plate as claimed in claim 1, wherein said electromagnetic-wave shielding film is bonded on the conductive foil side surface thereof to said transparent substrate with a thermosetting resin.

3. An electromagnetic-wave shielding and light transmitting plate as claimed in claim 2, wherein said thermosetting resin is a cross-linkable thermosetting resin containing a cross linking agent.

4. An electromagnetic-wave shielding and light transmitting plate as claimed in claim 2, wherein said thermosetting resin after hardened has a refractive index substantially equal to the refractive index of said transparent adhesive agent of said electromagnetic-wave shielding film.

5. An electromagnetic-wave shielding and light transmitting plate as claimed in claim 1, wherein said electromagnetic-wave shielding film is bonded on the conductive foil side surface thereof to the transparent substrate with a transparent pressure-sensitive adhesive.

6. An electromagnetic-wave shielding and light transmitting plate as claimed in claim 5, wherein the transparent pressure-sensitive adhesive is directly applied on the surface of the pattern-etched conductive foil on said electromagnetic-wave shielding film.

7. An electromagnetic-wave shielding and light transmitting plate as claimed in claim 5, wherein said transparent pressure-sensitive adhesive has a refractive index substantially equal to the refractive index of said transparent adhesive agent of said electromagnetic-wave shielding film.

8. An electromagnetic-wave shielding and light transmitting plate as claimed in claim 1, wherein said electromagnetic-wave shielding and light transmitting plate comprises a laminated body formed by laminating and uniting a single piece of the transparent substrate with an antireflection film as the front-most layer, said electromagnetic-wave shielding film provided between the transparent substrate and the antireflection film, and a near-infrared ray blocking film provided between the electromagnetic-wave shielding film and the transparent substrate.

9. An electromagnetic-wave shielding and light transmitting plate as claimed in claim 8, wherein said electromagnetic-wave shielding and light transmitting plate comprises a laminated body formed by laminating and uniting a single piece of the transparent substrate with the antireflection film as the front-most layer, said electromagnetic-wave shielding film provided between the transparent substrate and the antireflection film, and the near-infrared ray blocking film provided on an opposite side of the transparent substrate as said electromagnetic-wave shielding film.

10. An electromagnetic-wave shielding and light transmitting plate as claimed in claim 9, wherein a first conductive tape is bonded to and wound around the peripheral ends of said transparent substrate and the electromagnetic-wave shielding film bonded to the transparent substrate to extend from the front surface of the electromagnetic-wave shielding film to the rear surface of the transparent substrate,
   at least a portion of the peripheries of said antireflection film is backed off from the corresponding periphery of said electromagnetic-wave shielding film, and
   a second conductive tape is bonded to said laminated body to extend from edge portions of the front-most surface to edge portions of the rear-most surface through the peripheral ends of said laminated body.

11. An electromagnetic-wave shielding and light transmitting plate as claimed in claim 8, wherein a first conductive tape is bonded to and wound around the peripheral ends of the electromagnetic-wave shielding film to extend from one surface to the other surface of the electromagnetic-wave shielding film,
   the peripheries of said antireflection film are at least partially backed off from the peripheries of said electromagnetic-wave shielding film, and
   a second conductive tape is bonded to said laminated body to extend from edge portions of the front-most surface to edge portions of the rear-most surface through the peripheral ends of said laminated body.

* * * * *